US012790680B2

(12) United States Patent
Ahn et al.

(10) Patent No.: US 12,790,680 B2
(45) Date of Patent: Nov. 10, 2026

(54) DEPOSITION APPARATUS

(71) Applicant: Samsung Display Co., Ltd., Yongin-si (KR)

(72) Inventors: Junghyun Ahn, Yongin-si (KR); Jaesuk Moon, Yongin-si (KR); Seungjin Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 433 days.

(21) Appl. No.: 18/443,710

(22) Filed: Feb. 16, 2024

(65) Prior Publication Data

US 2024/0352570 A1 Oct. 24, 2024

(30) Foreign Application Priority Data

Apr. 20, 2023 (KR) ........................ 10-2023-0052105

(51) Int. Cl.

*C23C 14/04* (2006.01)
*H10K 59/12* (2023.01)
*H10K 71/16* (2023.01)

(52) U.S. Cl.

CPC ............ *C23C 14/042* (2013.01); *H10K 59/12* (2023.02); *H10K 71/166* (2023.02)

(58) Field of Classification Search

None

See application file for complete search history.

(56) References Cited

U.S. PATENT DOCUMENTS

| | | | | |
|---|---|---|---|---|
| 3,276,423 A * | 10/1966 | Triller | H05K 3/143 118/504 |
| 9,765,428 B2 | 9/2017 | Han | |
| 9,773,600 B2 | 9/2017 | Han et al. | |
| 2010/0025237 A1* | 2/2010 | Kim | C23C 14/042 204/298.18 |
| 2012/0178190 A1* | 7/2012 | Krijne | C23C 14/50 427/292 |
| 2016/0248049 A1 | 8/2016 | Hong et al. | |

FOREIGN PATENT DOCUMENTS

| | | | | |
|---|---|---|---|---|
| KR | 10-2016-0104194 | | 9/2016 | |
| KR | 20190026997 | * | 3/2019 | H01L 51/0011 |
| KR | 10-2182674 | | 11/2020 | |
| KR | 10-2227479 | | 3/2021 | |
| KR | 10-2311586 | | 10/2021 | |

* cited by examiner

*Primary Examiner* — Keath T Chen

(74) *Attorney, Agent, or Firm* — CANTOR COLBURN LLP

(57) ABSTRACT

A deposition apparatus includes a mask frame, a plurality of masks disposed on the mask frame, a first plate disposed on the masks, a second plate disposed on the first plate, a plurality of upper driving units disposed between the first plate and the second plate, a plurality of lower driving units disposed between the upper driving units and the first plate, and a plurality of magnet units respectively disposed in magnet unit accommodation spaces. The upper driving units extend in a first direction and are arranged in a second direction intersecting the first direction, and the lower driving units extend in the second direction and are arranged in the first direction.

20 Claims, 19 Drawing Sheets

DEPOSITION APPARATUS

CROSS REFERENCE TO RELATED APPLICATION(S)

This application claims priority to and benefits of Korean Patent Application No. 10-2023-0052105 under 35 U.S.C. § 119, filed on Apr. 20, 2023, in the Korean Intellectual Property Office (KIPO), the entire contents of which are incorporated herein by reference.

BACKGROUND

1. Technical Field

The disclosure relates to a deposition apparatus.

2. Description of the Related Art

In recent years, an organic light emitting diode display (OLED) is being spotlighted as a next generation flat display device for its excellent brightness and viewing angle. Since the organic light emitting diode display does not need a separate light source different from a liquid crystal display, it is manufactured with a thin thickness and a light weight. In addition, the organic light emitting diode display has properties, such as low power consumption, high brightness, fast response speed, etc.

The organic light emitting diode display includes multiple organic light emitting elements each of which includes an anode, an organic light emitting layer, and a cathode. Holes and electrons are injected into the organic light emitting layer through the anode and the cathode and are recombined in the organic light emitting layer to generate excitons. The organic light emitting elements emit light when an excited state of the excitons returns to a ground state.

When the organic light emitting elements are manufactured, a mask is disposed on a substrate, and an organic material used to form the organic light emitting layer is provided on the substrate through openings defined on the mask. Since the mask includes metal and is formed very thin, it may not stay flat. A mask frame that fixes the mask and magnet units that suction-holds the mask flat to the substrate are used to allow the mask to stay flat. The magnet units are fixed to a magnet plate.

However, in a case where the mask is aligned parallel to a direction in which the magnet units are arranged, a repulsive force occurs between the magnet units and the mask, and the mask may be not suction-held flat to the substrate.

SUMMARY

The disclosure provides a deposition apparatus including a driving unit that moves magnet units to allow the magnet units to be aligned in a direction intersecting a direction in which masks extend.

According to an embodiment of the disclosure, a deposition apparatus may include a mask frame, a plurality of masks disposed on the mask frame, a first plate disposed on the masks, a second plate disposed on the first plate, a plurality of upper driving units disposed between the first plate and the second plate, a plurality of lower driving units disposed between the plurality of upper driving units and the first plate, and a plurality of magnet units respectively disposed in magnet unit accommodation spaces.

The plurality of upper driving units may extend in a first direction and may be arranged in a second direction intersecting the first direction, the plurality of lower driving units may extend in the second direction and may be arranged in the first direction, each of the plurality of upper driving units may include an upper supporter and a plurality of upper barrier walls disposed on a lower surface of the upper supporter, each of the lower driving units may include a lower supporter and a plurality of lower barrier walls disposed on an upper surface of the lower supporter, and each of the magnet unit accommodation spaces may be a space between the plurality of upper barrier walls adjacent to each other in the first direction and the plurality of lower barrier walls adjacent to each other in the second direction.

Each of the plurality of upper driving units may independently move in a direction substantially parallel to the first direction, and the plurality of magnet units overlapping the plurality of upper driving units in a plan view may move in the direction substantially parallel to the first direction by a movement of the plurality of upper driving units.

A guide rail on which a guide groove extending in the first direction is defined may be formed on a lower surface of the second plate, and a guide groove coupling member may be formed on a first surface of the plurality of upper driving units to move along the guide rail.

Each of the plurality of lower driving units may independently move in a direction substantially parallel to the second direction, and the plurality of magnet units overlapping the plurality of lower driving units in a plan view may move in the direction substantially parallel to the second direction by a movement of the plurality of lower driving units.

A guide rail on which a guide groove extending in the second direction is defined may be formed on an upper surface of the first plate, and a guide groove coupling member may be formed on a first surface of the plurality of lower driving units to move along the guide rail.

The plurality of magnet units may include first magnet units and second magnet units having a polarity direction different from the first magnet units, the plurality of upper driving units and the plurality of lower driving units may operate in a first mode, a second mode, and a third mode, and the first magnet units and the second magnet units may alternately arranged in the first direction and the second direction in the first mode.

The first mode may be changed to the second mode by a movement of the plurality of upper driving units, a same type among the first magnet units and the second magnet units may be arranged in the second direction in the second mode, and the first magnet units and the second magnet units may be alternately arranged in the first direction in the second mode.

The plurality of masks may extend in the first direction and may be arranged in the second direction.

The first mode may be changed to the third mode by a movement of the plurality of lower driving units, a same type among the first magnet units and the second magnet units may be arranged in the first direction in the third mode, and the first magnet units and the second magnet units may be alternately arranged in the second direction in the third mode.

The plurality of masks may extend in the second direction and may be arranged in the first direction.

The plurality of upper driving units may include a magnetic substance.

The magnetic substance may be a metal.

The plurality of magnet units may be respectively attached to the plurality of upper driving units overlapping in a plan view by an attractive force caused by a magnetic force of the plurality of upper driving units.

The plurality of lower driving units may be made of a non-magnetic substance.

The first plate may include a cooling plate.

The first plate may include an electrostatic chuck.

The deposition apparatus may further include a driving unit connected to the second plate, and the driving unit may move in a direction substantially parallel to a third direction intersecting each of the first direction and the second direction.

Each of the plurality of magnet units may have a cuboidal shape.

The plurality of upper barrier walls may be arranged in the first direction at regular intervals.

The plurality of lower barrier walls may be arranged in the second direction at regular intervals.

According to the above, the magnet units disposed between the barrier walls of the driving unit move together with the driving unit in case that the driving unit moves. Thus, the magnet units may be aligned in the direction intersecting the extension direction of the masks, and the repulsive force may not occur between the magnet units and the masks. Accordingly, the substrate may be prevented from being detached, and defects in deposition of the substrate may be reduced.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
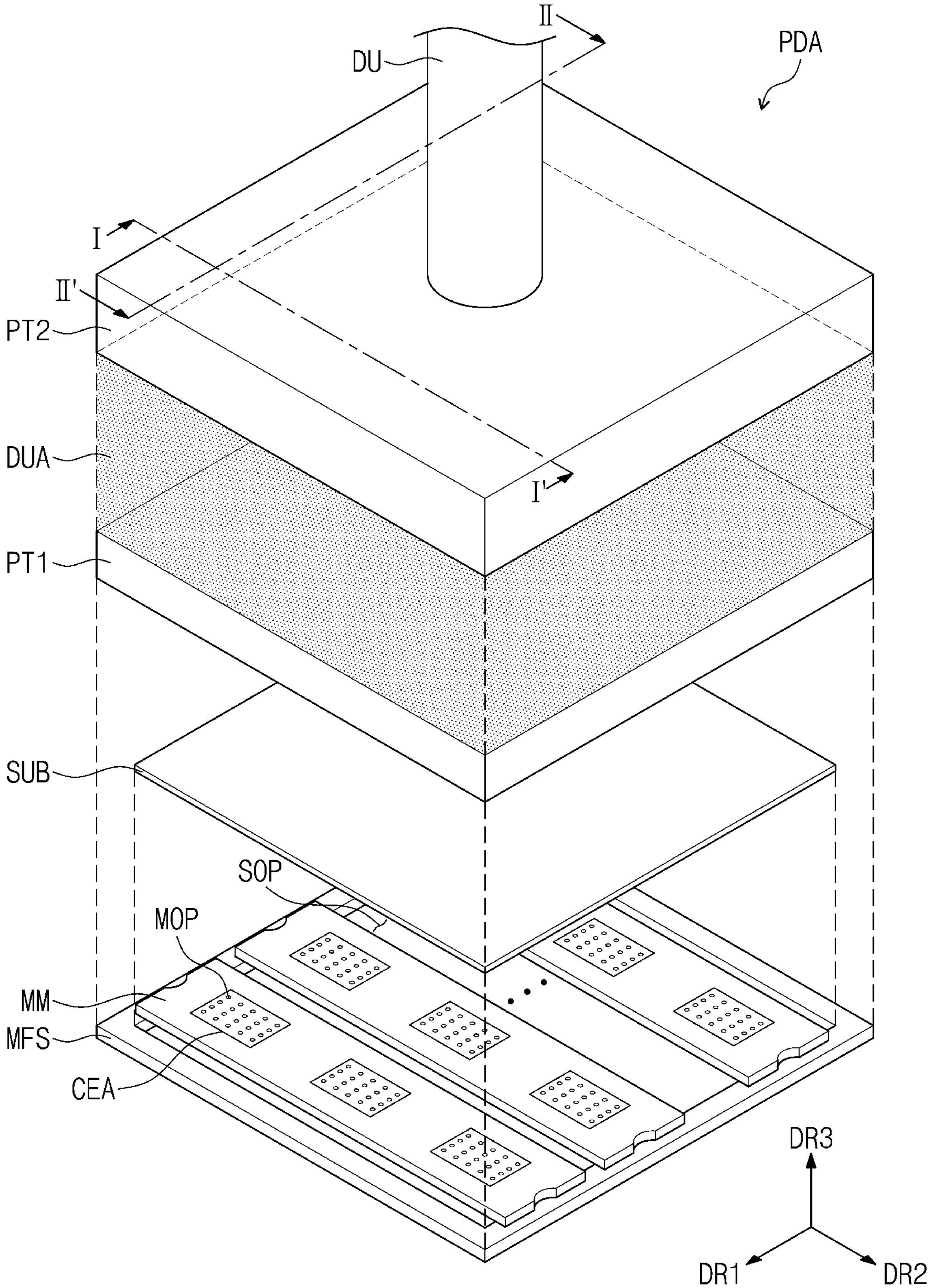
FIG. 1 is a perspective view of a deposition apparatus according to an embodiment of the disclosure.

The disclosure may be variously modified and realized in many different forms, and thus specific embodiments will be illustrated in the drawings and described in detail hereinbelow. However, the disclosure should not be limited to the specific disclosed forms, and be construed to include all modifications, equivalents, or replacements included in the spirit and scope of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a direction intersecting a plane defined by first and second directions DR1 and DR2 is referred to as a third direction DR3. The third direction DR3 may be perpendicular to the plane defined by the first and second directions DR1 and DR2. In the disclosure, the expression “when viewed in a cross-section” or “in a cross-sectional view” may mean a state of being viewed in the first direction DR1 or the second direction DR2. The expression “when viewed in a plane” or “in a plan view” may mean a state of being viewed in the third direction DR3. Directions indicated by the first, second, and third directions DR1, DR2, and DR3 are relative each other and may be changed to other directions.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a deposition apparatus PDA according to embodiments of the disclosure will be described with reference to accompanying drawings.

FIG. 1 is a perspective view of the deposition apparatus PDA according to an embodiment of the disclosure.

The deposition apparatus PDA may include a mask frame MFS, masks MM, a first plate PT1, a driving unit placement area DUA, a second plate PT2, and a driving unit DU.

The mask frame MFS may be a member on which the masks MM are disposed. The mask frame MFS may have a quadrangular shape in a plan view with side surfaces extending in the first direction DR1 and side surfaces extending in the second direction DR2 intersecting the first direction DR1. The mask frame MFS may have a quadrangular frame shape in a plan view, however, the shape of the mask frame MFS should not be limited thereto or thereby.

A mask opening SOP may be defined on the mask frame MFS. The mask opening SOP may have a quadrangular shape in a plan view, however, the shape of the mask opening SOP should not be limited to the quadrangular shape. The mask frame MFS may pass a gaseous deposition material DPM (refer to FIG. 10) through the mask opening SOP.

The mask frame MFS may include a metal material. For example, the mask frame MFS may include invar or stainless steel.

The mask frame MFS may provide a surface supporting the masks MM. The masks MM may be disposed on a same plane by the mask frame MFS, and the masks MM may be tightly adhered to a substrate SUB in a deposition process.

The masks MM may be disposed on the mask frame MFS. Both sides of the masks MM may be connected to the mask frame MFS. For example, the masks MM may be connected to the mask frame MFS by a laser welding method.

The masks MM may extend in a direction and may be arranged in a direction intersecting the direction. For example, each of the masks MM may extend in the second direction DR2, and the masks MM may be arranged in the first direction DR1 as shown in FIG. 1, however, the disclosure should not be limited thereto or thereby. According to an embodiment, the masks may extend in the first direction DR1 and may be arranged in the second direction DR2.

The masks MM may include a metal material. For example, each of the masks MM may be a fine metal mask.

Each of the masks MM may include multiple cell areas CEA defined therein. As shown in FIG. 1, three cell areas CEA may be defined in each of the masks MM, however, the number of the cell areas CEA should not be limited to three.

The cell areas CEA may be arranged in a direction. For example, the cell areas CEA may be arranged in the second direction DR2 as shown in FIG. 1, however, the arrangement direction of the cell areas CEA should not be limited thereto or thereby.

The cell area CEA may correspond to an area in which a display panel DP (refer to FIG. 8) is formed on the substrate SUB during the deposition process. Light emitting elements of one display panel DP (refer to FIG. 8) may be formed using one cell area CEA. Unit areas corresponding to the display panel DP (refer to FIG. 8) may be defined on the substrate SUB. After the light emitting elements are formed in the unit areas, the unit areas may be cut. Accordingly, the display panels DP (refer to FIG. 8) may be manufactured, however, the disclosure should not be limited thereto or thereby. According to an embodiment, one display panel DP (refer to FIG. 8) may be formed on one substrate SUB.

The cell areas CEA may have a shape corresponding to the display panels DP (refer to FIG. 8) formed on the substrate SUB. For example, each of the cell areas CEA may have a rectangular shape in a plan view with short sides extending in the first direction DR1 and long sides extending in the second direction DR2 as shown in FIG. 1, however, the disclosure should not be limited thereto or thereby. According to an embodiment, the cell areas CEA may have a variety of shapes.

The masks MM may include an opened area and a closed area to allow the deposition material DPM (refer to FIG. 10) to be deposited at a specific position of the substrate SUB in case that the deposition material DPM (refer to FIG. 10) is deposited on the substrate SUB during the deposition process. The cell openings MOP may be defined as the opened area of the masks MM. The cell openings MOP may be arranged in the first direction DR1 and the second direction DR2 in the cell areas CEA. In a plan view, the cell openings MOP may overlap the mask opening SOP.

For example, twenty cell openings MOP may be defined in each of the cell areas CEA defined in the mask MM as shown in FIG. 1, however, the number of the cell openings MOP should not be limited thereto or thereby.

An area except the cell openings MOP in the cell areas CEA may be defined as the closed area of the mask MM. The deposition material DPM (refer to FIG. 10) may be provided in a gaseous state and may pass through only the cell openings MOP. Accordingly, the deposition material DPM (refer to FIG. 10) may be deposited at positions corresponding to the cell openings MOP on the substrate SUB using the masks MM in which the shape and the position of the cell openings MOP are adjusted.

The first plate PT1 may be disposed on the mask frame MFS and the masks MM. The first plate PT1 may have a hexahedral shape with an upper surface and a lower surface, which are defined by the first direction DR1 and the second direction DR2. However, the shape of the first plate PT1 should not be limited thereto or thereby and may have a variety of shapes.

The first plate PT1 may compress the substrate SUB to tightly adhere the substrate SUB to the mask MM.

The first plate PT1 may include a cooling plate. A pipe through which a coolant flows may be disposed in the cooling plate CP. The substrate SUB may contact the first plate PT1 in the deposition process. In a case where the substrate SUB is heated by the heated deposition material DPM (refer to FIG. 10), the substrate SUB may be thermally deformed. However, since the coolant is provided to the first plate PT1 that is in contact with the substrate SUB, the heated substrate SUB may be cooled by the coolant. Accordingly, the thermal deformation of the substrate SUB, which is caused by the heated deposition material DPM (refer to FIG. 10), may be prevented.

The first plate PT1 may include an electrostatic chuck. The electrostatic chuck may be a member that attaches an object using an electrostatic force. In case that an electric potential is applied to the electrostatic chuck, the object may be charged oppositely and may be fixed to the electrostatic chuck by an attractive force due to the electrostatic force. In case that the first plate PT1 includes the electrostatic chuck, the first plate PT1 may have the electrostatic force, and the first plate PT1 may help the mask MM and the substrate SUB adhere to each other by attraction by electrostatic force.

The driving unit placement area DUA may be defined between the first plate PT1 and the second plate PT2. Upper driving units UDU (refer to FIG. 2), magnet units MGU (refer to FIG. 2), and lower driving units LDU (refer to FIG. 2), which are described below, may be disposed in the driving unit placement area DUA. Components disposed in the driving unit placement area DUA will be described in detail with reference to FIGS. 2 to 7B.

The second plate PT2 may be disposed over the first plate PT1. The first plate PT1 may be disposed between the masks MM and the second plate PT2. The second plate PT2 may have a hexahedral shape with an upper surface and a lower surface defined by the first direction DR1 and the second direction DR2. However, the shape of the second plate PT2 should not be limited thereto or thereby and the second plate PT2 may have a variety of shapes.

The second plate PT2 may provide a surface combined with the upper driving units UDU (refer to FIG. 2) to allow the upper driving units UDU (refer to FIG. 2) to move on the surface defined by the first direction DR1 and the second direction DR2.

The driving unit DU may be disposed on the second plate PT2. The driving unit DU may be connected to the upper surface of the second plate PT2. The driving unit DU may have a cylindrical shape extending in the third direction DR3. However, the disclosure should not be limited there or thereby and the driving unit DU may have a variety of shapes.

Figure 2:
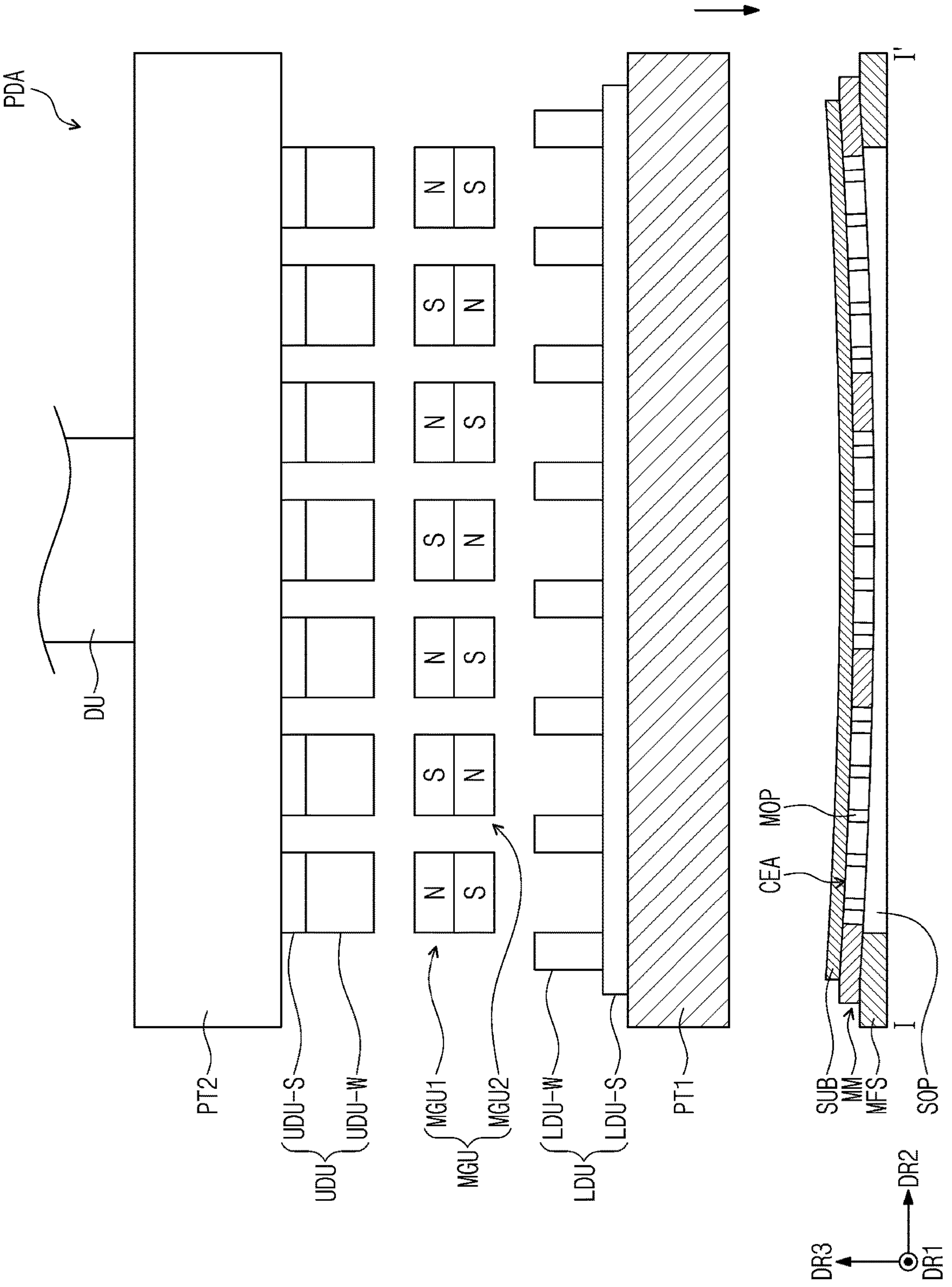
FIG. 2 is a schematic cross-sectional view of a deposition apparatus according to an embodiment of the disclosure.
Figure 3:
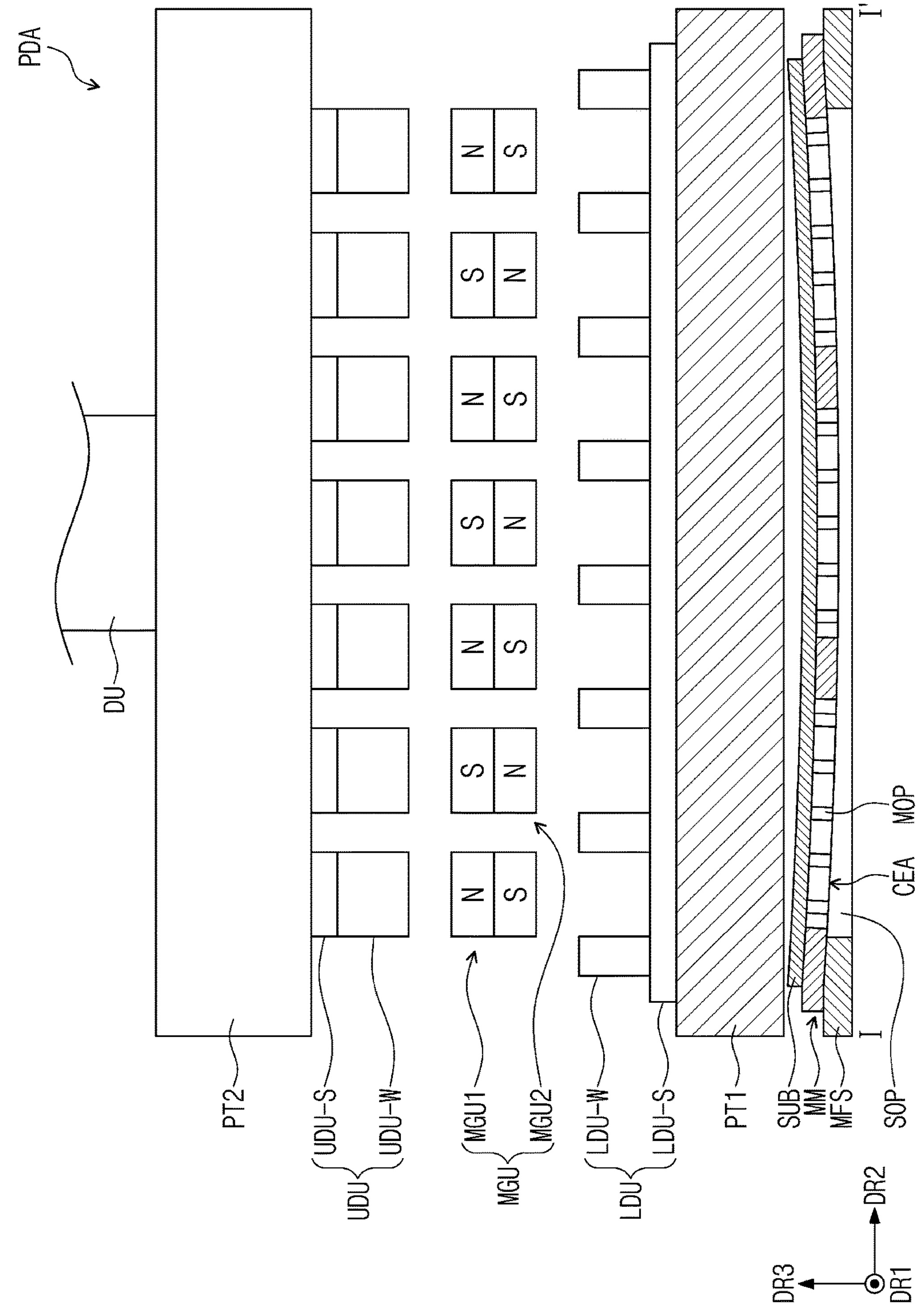
FIG. 3 is a schematic cross-sectional view of a deposition apparatus according to an embodiment of the disclosure.

FIGS. 2 and 3 are schematic cross-sectional views of the deposition apparatus PDA taken along line I-I' of FIG. 1. FIG. 3 shows the deposition apparatus PDA after moving the driving unit DU of FIG. 2 in a direction opposite to the third direction DR3. However, for the convenience of explanation, the upper driving units UDU, the magnet units MGU, and the lower driving units LDU are shown as being separated from each other in FIGS. 2 and 3.

The upper driving units UDU, the magnet units MGU, and the lower driving units LDU may be disposed in the driving unit placement area DUA (refer to FIG. 1) defined between the first plate PT1 and the second plate PT2.

The upper driving unit UDU may be a member to move the magnet units MGU overlapping in a direction. The upper driving unit UDU may include an upper supporter UDU-S and upper barrier walls UDU-W.

Figure 4:
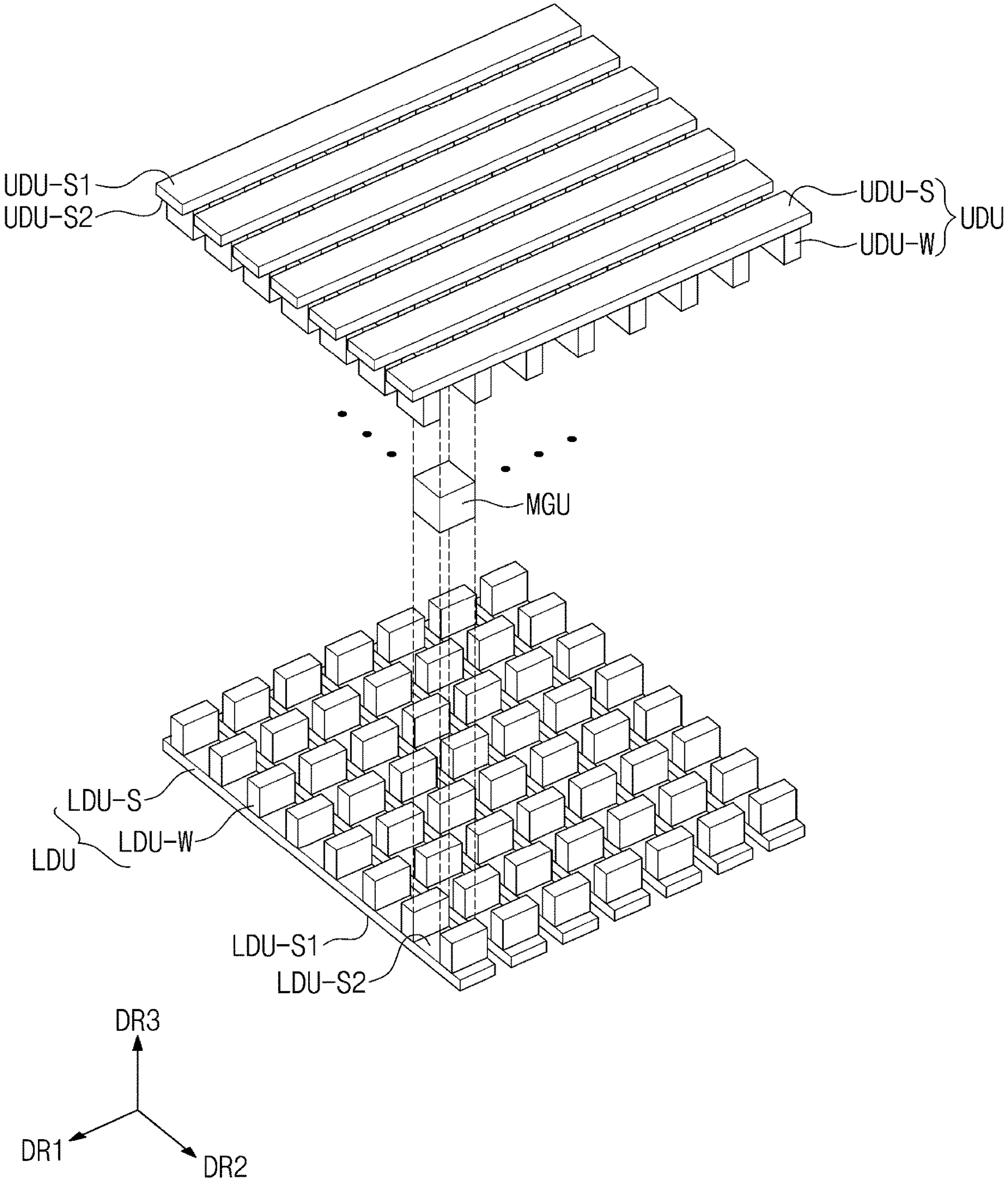
FIG. 4 is an exploded perspective view of a portion of a deposition apparatus according to an embodiment of the disclosure.

The upper supporter UDU-S may include an upper first surface UDU-S1 (refer to FIG. 4) and an upper second surface UDU-S2 (refer to FIG. 4). The upper first surface UDU-S1 (refer to FIG. 4) may face the lower surface of the second plate PT2. The upper second surface UDU-S2 (refer to FIG. 4) may face the upper first surface UDU-S1 (refer to FIG. 4). The upper barrier walls UDU-W may be disposed on the upper second surface UDU-S2 (refer to FIG. 4). The structure and shape of the upper driving unit UDU will be described in detail with reference to FIG. 4.

The lower driving unit LDU may be a member to move the magnet units MGU overlapping in a direction. The lower driving unit LDU may include a lower supporter LDU-S and lower barrier walls LDU-W.

The lower supporter LDU-S may include a lower first surface LDU-S1 (refer to FIG. 4) and a lower second surface LDU-S2 (refer to FIG. 4). The lower first surface LDU-S1 (refer to FIG. 4) may face the first plate PT1. The lower second surface LDU-S2 (refer to FIG. 4) may face the lower first surface LDU-S1 (refer to FIG. 4). The lower barrier walls LDU-W may be disposed on the lower second surface LDU-S2 (refer to FIG. 4). The structure and shape of the lower driving unit LDU will be described in detail with reference to FIG. 4.

The magnet units MGU may be a member with magnetic force. The magnet units MGU may have a cuboidal shape. In case that the magnet units MGU have a cuboidal shape, the magnet units MGU may have a quadrangular shape in a cross-sectional view. However, the shape of the magnet units MGU should not be particularly limited as long as the magnet units MGU have the magnetic force.

The magnet units MGU may include a magnetic material with the magnetic force. For example, the magnet units MGU may include a permanent magnet. Each of the magnet units MGU may have a first polarity and a second polarity different from the first polarity. For example, the first polarity may be defined as a magnet's north (N) pole, and the second polarity may be defined as a magnet's south(S) pole.

The magnet units MGU may be distinguished by first magnet units MGU1 and second magnet units MGU2 according to a direction of polarity. The first magnet units MGU1 may be defined as magnet units MGU arranged to allow the magnet's south(S) pole to face the masks MM. The second magnet units MGU2 may be defined as magnet units MGU arranged to allow the magnet's north (N) pole to face the masks MM.

As shown in FIGS. 2 and 3, since the mask MM does not receive a normal force by the mask frame MFS in a portion overlapping the mask opening SOP, the mask MM may be bent in a direction in which gravity acts. For example, the masks MM may be bent in the direction opposite to the third direction DR3. The magnet units MGU may apply an attractive force, which is caused by the magnetic field, to the mask MM, and thus, the mask MM may be prevented from being bent.

The expression "Magnet units MGU are aligned" may mean that the magnet units MGU with a same polarity direction are arranged in a direction. An alignment direction of the magnet units MGU may be defined as a direction in which the magnet units MGU with a same polarity direction are arranged. In a case where the extension direction of the masks MM is parallel to the alignment direction of the magnet units MGU, a repulsive force may be partially generated between the masks MM and the magnet units MGU due to the magnetic field generated by the magnet units MGU. The repulsive force may prevent the masks MM and the substrate SUB from being tightly attached to each other in the deposition process and thus may cause a detachment of the substrate SUB. In a case where the substrate SUB is detached, deposition defects may occur in the substrate SUB. According to the disclosure, the arrangement direction of the magnet units MGU may be adjusted to allow the alignment direction of the magnet units MGU to intersect the extension direction of the masks MM. Accordingly, the detachment phenomenon of the substrate SUB may be prevented. Accordingly, the substrate SUB may be prevented from being detached.

The driving unit DU may move linearly in a direction parallel to the third direction DR3. The second plate PT2 connected to the driving unit DU may move linearly in a direction parallel to the third direction DR3 with the movement of the driving unit DU. Due to the movement of the second plate PT2, the upper driving units UDU connected to the second plate PT2 may also move linearly in a direction parallel to the third direction DR3.

FIG. 4 is an exploded perspective view of a portion of the deposition apparatus according to an embodiment of the disclosure. FIG. 4 shows an overlapping arrangement between the upper driving units UDU, the magnet units MGU, and the lower driving units LDU.

The upper driving units UDU may be arranged in the second direction DR2, and the lower driving units LDU may be arranged in the first direction DR1. However, the arrangement directions of the upper driving units UDU and the lower driving units LDU should not be particularly limited as long as the arrangement direction of the upper driving units UDU intersects the arrangement direction of the lower driving units LDU. For example, the upper driving units UDU may be arranged in the first direction DR1, and the lower driving units LDU may be arranged in the second direction DR2.

FIG. 4 shows seven upper driving units UDU arranged in the second direction DR2 and seven lower driving units LDU arranged in the first direction DR1. However, the number of the upper driving units UDU and the number of the lower driving units LDU included in the deposition apparatus PDA (refer to FIG. 1) should not be limited thereto or thereby.

The upper supporter UDU-S may be coupled with the upper barrier walls UDU-W. The upper supporter UDU-S may be a polyhedron. For example, the upper supporter UDU-S may be a hexahedron. However, the shape of the upper supporter UDU-S should not be particularly limited as long as the upper supporter UDU-S provides a surface coupled with the upper barrier walls UDU-W. The upper supporter UDU-S may extend in a direction intersecting the direction in which the upper driving units UDU are arranged. FIG. 4 shows the structure in which the upper supporter UDU-S extends in the first direction DR1.

The upper supporter UDU-S may include the upper first surface UDU-S1 facing the second plate PT2 (refer to FIG. 3). The upper first surface UDU-S1 may be coupled with the lower surface of the second plate PT2 (refer to FIG. 3). This will be described in detail with reference to FIG. 5D.

The upper barrier walls UDU-W may define a magnet accommodation space MGUS (refer to FIG. 5A) and may push the magnet unit MGU to move. Each of the upper barrier walls UDU-W may be a polyhedron. For example, the upper barrier wall UDU-W may be a hexahedron. However, the shape of the upper barrier wall UDU-W should not be particularly limited as long as the upper barrier wall UDU-W defines the magnet accommodation space MGUS and applies a pushing force to the magnet unit MGU.

The upper barrier walls UDU-W may be arranged in a direction substantially parallel to the extension direction of the upper supporter UDU-S on the upper second surface UDU-S2. FIG. 4 shows the structure in which the upper barrier walls UDU-W are arranged in a direction parallel to the first direction DR1. The upper barrier walls UDU-W may be arranged spaced apart from each other on the upper second surface UDU-S2. For example, the upper barrier walls UDU-W may be arranged spaced apart from each other at regular intervals.

The upper barrier walls UDU-W arranged in the direction substantially parallel to the extension direction of the upper supporter UDU-S may be coupled with the upper supporter UDU-S. The upper barrier walls UDU-W coupled with the upper supporter UDU-S may move with the upper supporter UDU-S according to the movement of the upper supporter UDU-S.

The upper driving unit UDU may include a magnetic substance. For example, the upper supporter UDU-S may include a metal, however, the disclosure should not be limited thereto or thereby. According to an embodiment, the entire of the upper driving unit UDU may be a non-magnetic substance.

Figure 5A:
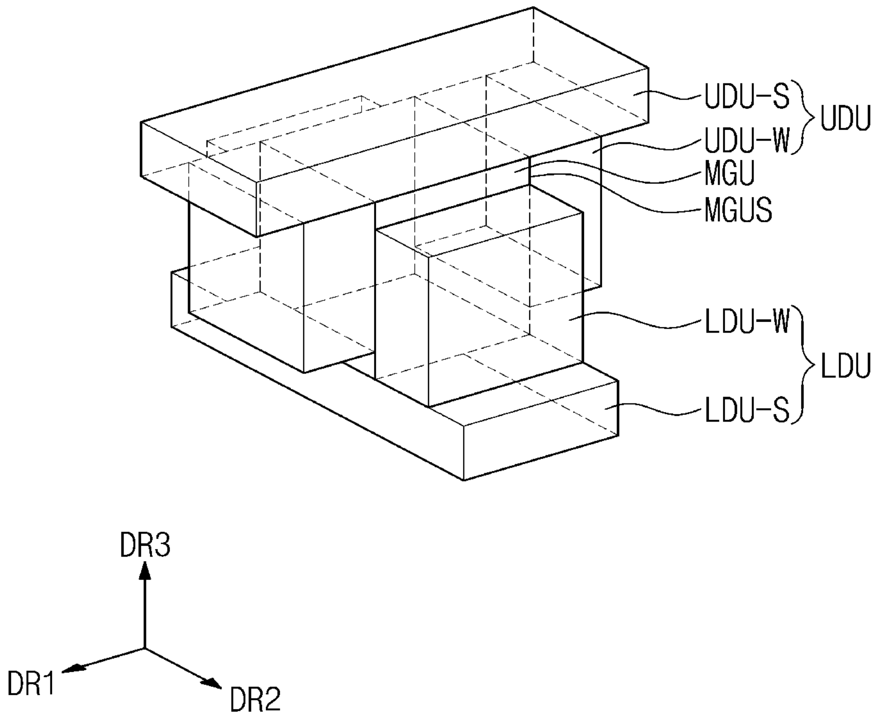
FIG. 5A is an enlarged view of a portion of a deposition apparatus according to an embodiment of the disclosure.

In case that the upper driving unit UDU includes a magnetic substance, the magnet units MGU may be attached to the upper driving unit UDU by an attractive force caused by the magnetic force, and the magnet units MGU may be prevented from shaking in the magnet accommodation space MGUS (refer to FIG. 5A). However, such attachment does not imply a permanent fixation or bonding. For example, in case that the arrangement of the magnet units MGU is changed by the movement of the lower driving unit LDU, the upper driving unit UDU and the magnet units MGU may be separated from each other and reattached to each other after changes in arrangement.

The upper driving unit UDU may move in a direction parallel to the extension direction of the upper supporter UDU-S on the lower surface of the second plate PT2 (refer to FIG. 3). For example, the upper driving units UDU shown in FIG. 4 may move in a direction parallel to the first direction DR1.

In case that the upper driving unit UDU moves, the upper barrier walls UDU-W included in the upper driving unit UDU may move with the upper driving unit UDU. In case that the upper barrier walls UDU-W move, the upper barrier walls UDU-W may apply the pushing force to the magnet units MGU on a movement direction of the upper driving unit UDU to push the magnet units MGU to the movement direction of the upper driving unit UDU.

In case that the magnet units MGU are in contact with the upper driving units UDU and the upper driving units UDU moves, a frictional force may be applied to the magnet units MGU toward the movement direction of the upper driving unit UDU.

The upper driving unit UDU may overlap the magnet units MGU arranged in the extension direction of the upper supporter UDU-S among the magnet units MGU in a plan view. The magnet units MGU overlapping the upper driving units UDU on the move may move in the same direction as the movement direction of the upper driving unit UDU by the pushing force and the frictional force. As a result, the arrangement of the magnet units MGU may be changed by moving the upper driving units UDU.

The lower supporter LDU-S may be coupled with the lower barrier walls LDU-W. The lower supporter LDU-S may be a polyhedron. For example, the lower supporter LDU-S may be a hexahedron. However, the shape of the lower supporter LDU-S should not be particularly limited as long as the lower supporter LDU-S provides a surface coupled with the lower barrier walls LDU-W. The lower supporter LDU-S may extend in a direction intersecting a direction in which the lower driving units LDU are arranged. FIG. 4 shows the structure in which the lower supporter LDU-S extends in the second direction DR2.

The lower supporter LDU-S may include the lower first surface LDU-S1 facing the first plate PT1. The lower first surface LDU-S1 may be coupled with the first plate PT1 (refer to FIG. 3). This will be described in detail with reference to FIG. 5D.

The lower barrier walls LDU-W may define the magnet accommodation space MGUS (refer to FIG. 5A) and may push the magnet unit MGU to move. Each of the lower barrier walls LDU-W may be a polyhedron. For example, each of the lower barrier walls LDU-W may be a hexahedron. However, the shape of the lower barrier wall LDU-W should not be particularly limited as long as the lower barrier wall LDU-W defines the magnet accommodation space MGUS and applies a pushing force to the magnet unit MGU.

The lower barrier walls LDU-W may be arranged in a direction substantially parallel to the extension direction of the lower supporter LDU-S on the lower second surface LDU-S2. FIG. 4 shows the structure in which the lower barrier walls LDU-W are arranged in a direction parallel to the second direction DR2. The lower barrier walls LDU-W may be arranged spaced apart from each other on the lower second surface LDU-S2. For example, the lower barrier walls LDU-W may be arranged spaced apart from each other at regular intervals.

The lower barrier walls LDU-W arranged in a direction substantially parallel to the extension direction of the lower supporter LDU-S may be coupled with the lower supporter LDU-S. The lower barrier walls LDU-W coupled with the lower supporter LDU-S may move with the lower supporter LDU-S according to the movement of the lower supporter LDU-S.

The lower driving unit LDU may be made of a non-magnetic substance. In case that the lower driving unit LDU is made of the non-magnetic substance, the lower driving unit LDU may not interfere with the magnetic force of the magnet unit MGU acting on the mask MM. However, the lower driving unit LDU may partially include the magnetic substance as long as the lower driving unit LDU does not interfere with the magnetic force of the magnet unit MGU acting on the mask MM.

The lower driving unit LDU may move in a direction substantially parallel to the extension direction of the lower supporter LDU-S on the upper surface of the first plate PT1. For example, the lower driving units LDU shown in FIG. 4 may move in a direction parallel to the second direction DR2.

In case that the lower driving unit LDU moves, the lower barrier walls LDU-W included in the lower driving unit LDU may move with the lower driving unit LDU. In case that the lower barrier walls LDU-W move, the lower barrier walls LDU-W may apply the pushing force to the magnet units MGU on a movement direction of the lower driving unit LDU to push the magnet units MGU to the movement direction of the lower driving unit LDU.

In case that the magnet units MGU are in contact with the lower driving unit LDU and the lower driving unit LDU moves, a frictional force may be applied to the magnet units MGU toward the movement direction of the lower driving unit LDU.

The lower driving unit LDU may overlap the magnet units MGU arranged in the extension direction of the lower supporter LDU-S among the magnet units MGU in a plan view. The magnet units MGU overlapping the lower driving units LDU on the move may move in the same direction as the movement direction of the lower driving unit LDU by the pushing force and the frictional force. As a result, the arrangement of the magnet units MGU may be changed by moving the lower driving units LDU.

Figure 5B:
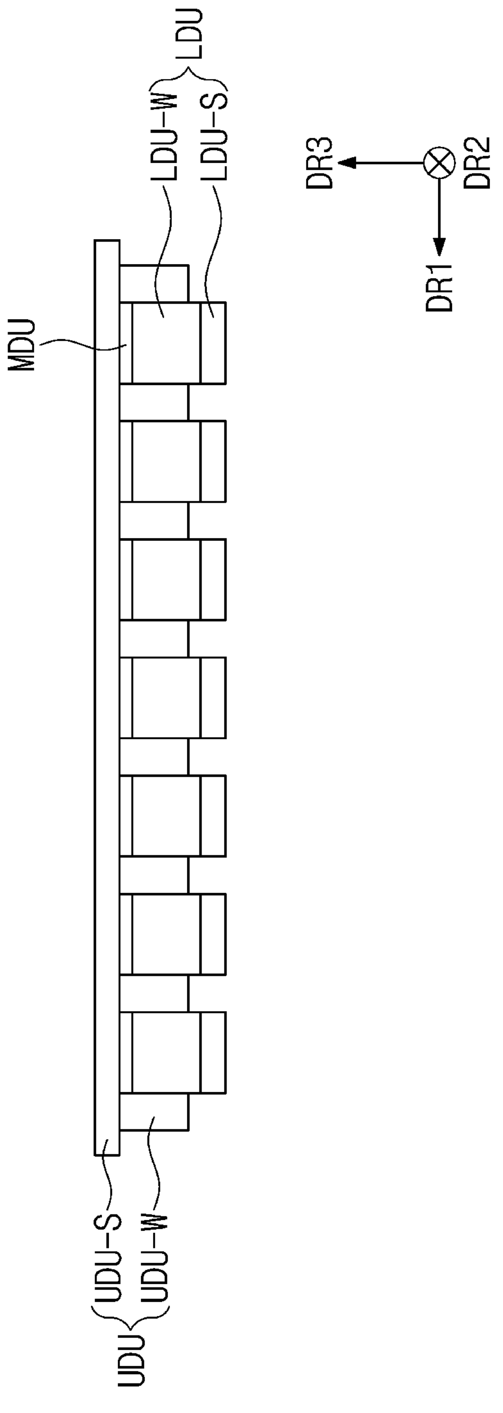
FIG. 5B is a lateral view of a portion of a deposition apparatus according to an embodiment of the disclosure.
Figure 5C:
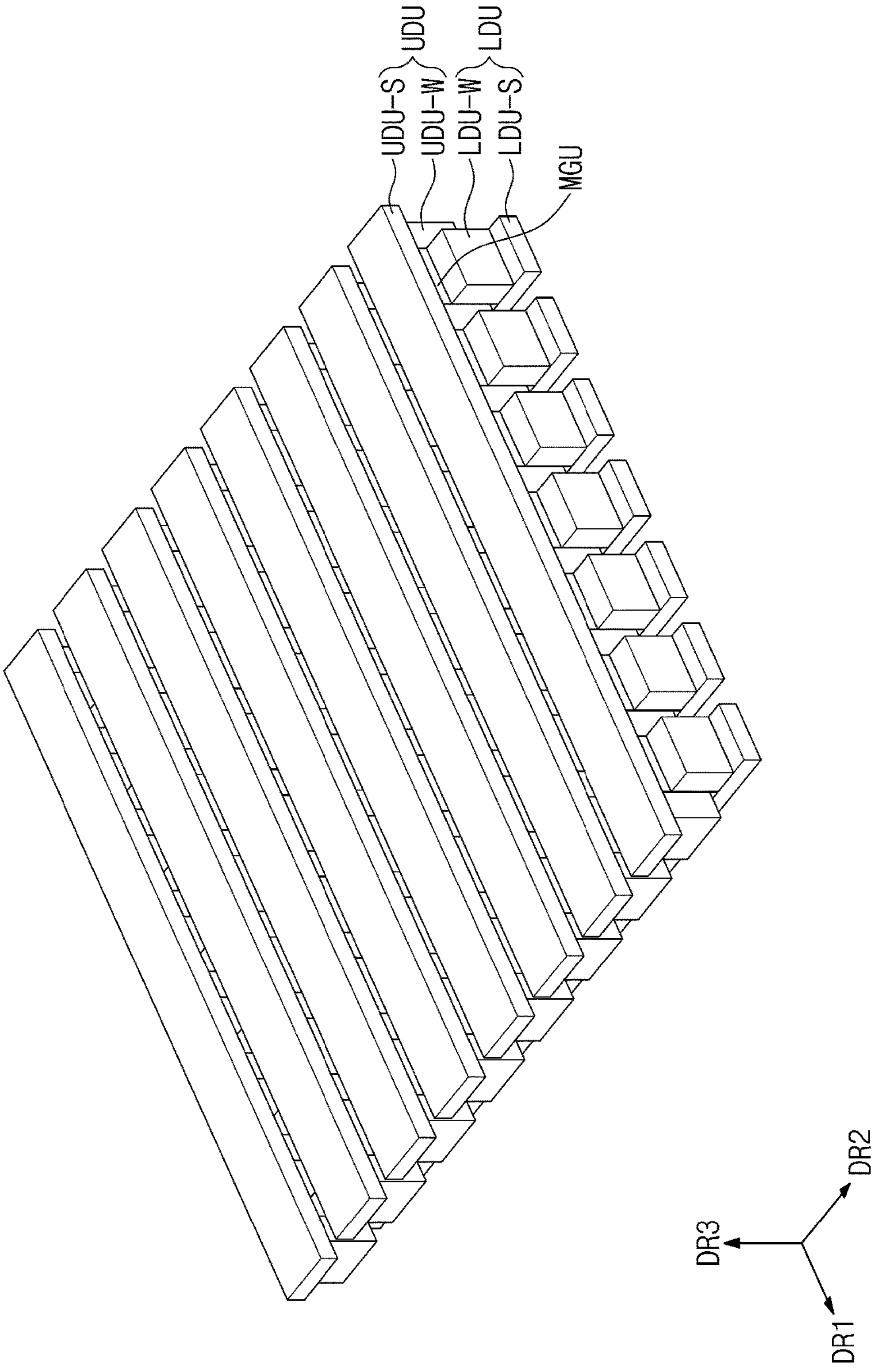
FIG. 5C is a perspective view of a portion of a deposition apparatus according to an embodiment of the disclosure.

FIGS. 5A to 5C are views illustrating an overlapping state between the upper driving units UDU, the magnet units MGU, and the lower driving units LDU.

FIG. 5A is an enlarged view illustrating the upper driving unit UDU, the magnet unit MGU, and the lower driving unit LDU, which correspond to one magnet accommodation space MGUS. FIG. 5B is a lateral view illustrating a structure in which one upper driving unit UDU extending in the direction parallel to the first direction DR1 overlaps the lower driving units LDU arranged parallel to the first direction DR1. FIG. 5C is a perspective view illustrating the upper driving units UDU, the lower driving units LDU, and the magnet units MGU disposed in the magnet accommodation spaces MGUS defined by the upper driving units UDU and the lower driving units LDU overlapping each other.

The magnet unit MGU may be disposed in the magnet accommodation space MGUS of the deposition apparatus PDA (refer to FIG. 1). The magnet accommodation space MGUS may be defined between the upper barrier walls UDU-W adjacent to each other in the first direction DR1 and the lower barrier walls LDU-W adjacent to each other in the second direction DR2. FIG. 5A shows one magnet accommodation space MGUS as an embodiment. Referring to FIG. 5C, the deposition apparatus PDA (refer to FIG. 1) may include multiple upper barrier walls UDU-W and multiple lower barrier walls LDU-W, and thus, the magnet accommodation space MGUS may also be provided in plural.

The magnet units MGU may be respectively disposed in the magnet accommodation spaces MGUS. For example, one magnet unit MGU may be disposed in one magnet accommodation space MGUS as shown in FIG. 5A, however, the disclosure should not be limited thereto or thereby. According to an embodiment, multiple magnet units MGU may be disposed in one magnet accommodation space MGUS.

Since the magnet unit MGU is disposed in the magnet accommodation space MGUS, a volume of the magnet accommodation space MGUS may be substantially equal to or greater than a volume of the magnet unit MGU. For example, FIG. 5A shows the structure in which the volume of the magnet accommodation space MGUS is substantially equal to the volume of the magnet unit MGU. However, the volume of the magnet accommodation space MGUS should not be particularly limited as long as the magnet unit MGU is disposed in the magnet accommodation space MGUS.

The upper driving unit UDU may have a structure allowing the lower driving unit LDU, which intersects the upper driving unit UDU, to move readily. For example, a width in the second direction DR2 of the upper barrier wall UDU-W may be substantially equal to or less than a distance between the lower barrier walls LDU-W included in one lower driving unit LDU and adjacent to each other in the second direction DR2 (refer to FIG. 5B). According to an embodiment, a height in the third direction DR3 of the upper barrier wall UDU-W may be substantially equal to or less than a distance in the third direction DR3 between the upper supporter UDU-S and the lower supporter LDU-S (refer to FIG. 5B).

The lower driving unit LDU may have a structure allowing the upper driving unit UDU, which intersects the lower driving unit LDU, to move readily. For example, a width in the first direction DR1 of the lower barrier wall LDU-W may be substantially equal to or less than a distance between the upper barrier walls UDU-W included in one upper driving unit UDU and adjacent to each other in the first direction DR1 (refer to FIG. 5B). According to an embodiment, a height in the third direction DR3 of the lower barrier wall LDU-W may be substantially equal to or less than the distance in the third direction DR3 between the lower supporter LDU-S and the upper supporter UDU-S and (refer to FIG. 5B).

Referring to FIG. 5A, at least a portion of the magnet unit MGU may be in contact with the upper second surface UDU-S2 (refer to FIG. 4), however, the disclosure should not be limited thereto or thereby.

At least a portion of the magnet unit MGU may be in contact with the lower driving unit LDU. In case that the lower supporter LDU-S is in contact with the portion of the magnet unit MGU, the lower supporter LDU-S may provide a normal force to the magnet unit MGU.

Referring to FIGS. 5B and 5C, a distance in the first direction DR1 between the lower supporters LDU-S may be less than a width in the first direction DR1 of the magnet unit MGU. Accordingly, in case that the magnet units MGU move in the first direction DR1, the magnet units MGU may be supported by the lower supporters LDU-S.

Figure 5D:
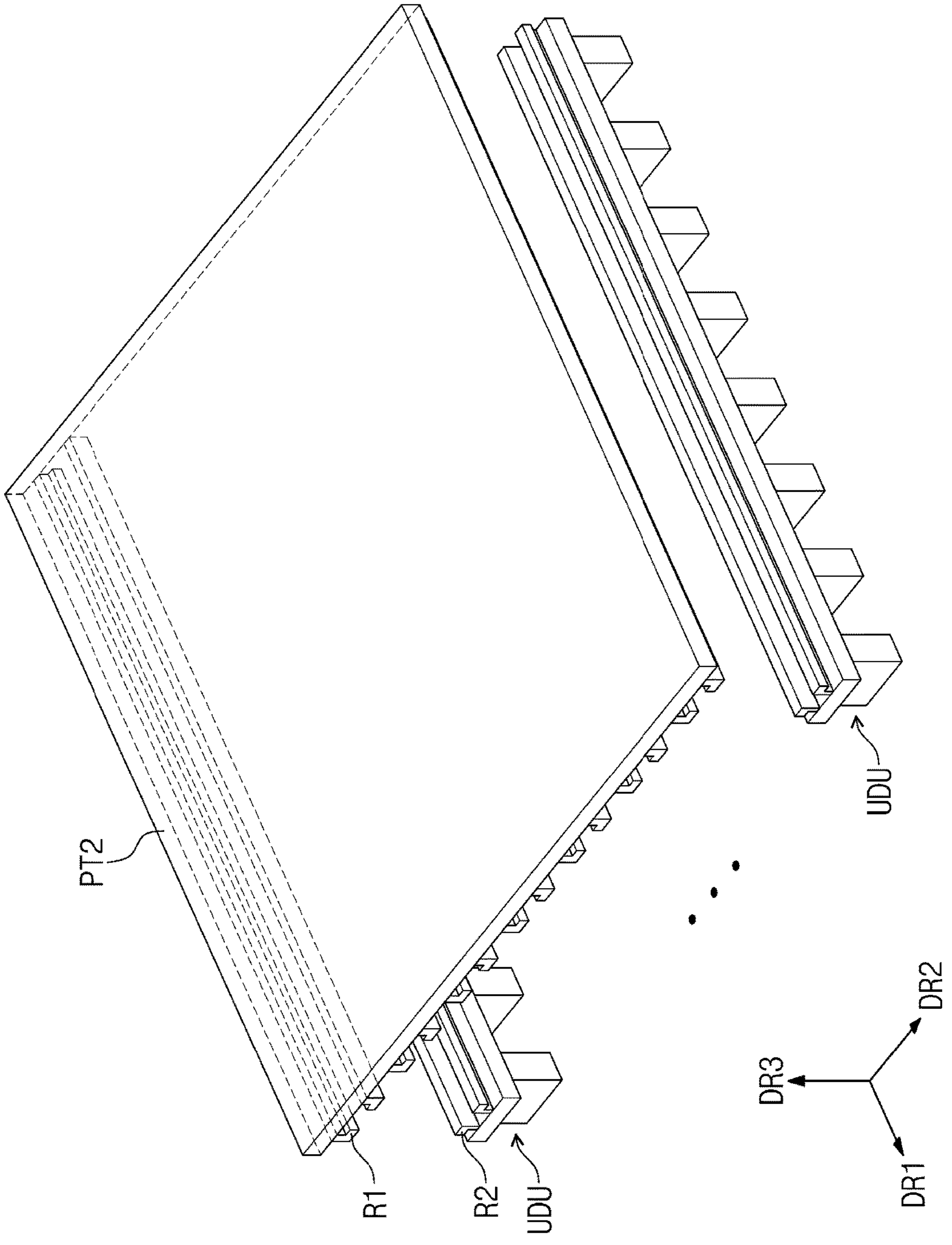
FIG. 5D is a perspective view of a portion of a deposition apparatus according to an embodiment of the disclosure.

FIG. 5D is a perspective view of the second plate PT2 and the upper driving units UDU. FIG. 5D shows an embodiment of the upper driving units UDU coupled with the second plate PT2.

The lower surface of the second plate PT2 may include a first coupling member R1 coupled with the upper first surface UDU-S1 (refer to FIGS. 2 and 3). The upper first surface UDU-S1 (refer to FIGS. 2 and 3) may include a second coupling member R2 coupled with the second plate PT2 and moving on the second plate PT2. The first coupling member R1 may be a guide rail on which a guide groove is defined. The guide groove may extend in the extension direction of the upper driving unit UDU coupled with the guide groove. For example, the guide groove may extend in the first direction DR1. The second coupling member R2 may correspond to a guide groove coupling member that moves along the guide rail. The upper driving unit UDU may move along the guide rail extending in the first direction DR1 in a direction parallel to the first direction DR1. However, the structure of the first coupling member R1 and the second coupling member R2 should not be particularly limited as long as the first coupling member R1 and the second coupling member R2 are coupled with each other to allow the upper driving unit UDU to move on the lower surface of the second plate PT2.

The first coupling members R1 of the lower surface of the second plate PT2 may be provided in plural corresponding to the number of the upper driving units UDU coupled with the second plate PT2. Each of the upper driving units UDU may include the second coupling member R2 coupled with the first coupling member R1 overlapping in a plan view. The upper driving units UDU may be coupled with the first coupling members R1, respectively. As a result, the upper driving units UDU may move independently in the first direction DR1.

Similarly, the lower driving unit LDU (refer to FIG. 3) may move in combination with the first plate PT1 (refer to FIG. 3). The upper surface of the first plate PT1 (refer to FIG. 3) may include a third coupling member (not shown) coupled with the lower first surface LDU-S1 (refer to FIG. 4). The lower first surface LDU-S1 (refer to FIG. 4) may include a fourth coupling member (not shown) coupled with first plate PT1 (refer to FIG. 3) and moving on the first plate PT1 (refer to FIG. 3). The third coupling member (not shown) may correspond to a guide rail on which a guide groove is defined. The fourth coupling member (not shown) may correspond to a guide groove coupling member that moves the guide rail. However, the structure of the third coupling member and the fourth coupling member should not be particularly limited as long as the third coupling member and the fourth coupling member are coupled with each other to allow the lower driving unit LDU (refer to FIG. 3) to move on the upper surface of the first plate PT1 (refer to FIG. 3).

FIGS. 6A to 6F are plan views illustrating an arrangement of the magnet units MGU according to the movement of the driving units.

Referring to FIGS. 6A to 6F, a magnet unit placement plane MUAP on which the magnet units MGU are arranged may be defined between the first plate PT1 (refer to FIG. 3) and the second plate PT2 (refer to FIG. 3). The magnet unit placement plane MUAP may include a first area A1 and a second area A2.

The first area A1 may overlap the masks MM (refer to FIG. 1) in a plan view. The first area A1 may overlap the mask opening SOP (refer to FIG. 1) in a plan view. The second area A2 may overlap the mask frame MFS (refer to FIG. 1) in a plan view. The second area A2 may surround the first area A1 in a plan view.

The second area A2 may include a second-first area A2-1, a second-second area A2-2, a second-third area A2-3, and a second-fourth area A2-4. The second-first area A2-1 and the second-third area A2-3 may extend in the second direction DR2. The second-second area A2-2 and the second-fourth area A2-4 may extend in the first direction DR1.

In a plan view, the second-first area A2-1 and the second-third area A2-3 may be disposed respectively adjacent to edges of the second plate PT2, which are opposite to each other in the first direction DR1. In a plan view, the second-second area A2-2 and the second-fourth area A2-4 may be disposed respectively adjacent to edges of the second plate PT2, which are opposite to each other in the second direction DR2.

The second-first area A2-1 and the second-third area A2-3 may be arranged with the first area A1 interposed between the second-first area A2-1 and the second-third area A2-3 in the first direction DR1. The second-second area A2-2 and the second-fourth area A2-4 may be arranged with the first area A1 interposed between the second-second area A2-2 and the second-fourth area A2-4 in the second direction DR2.

Figure 6A:
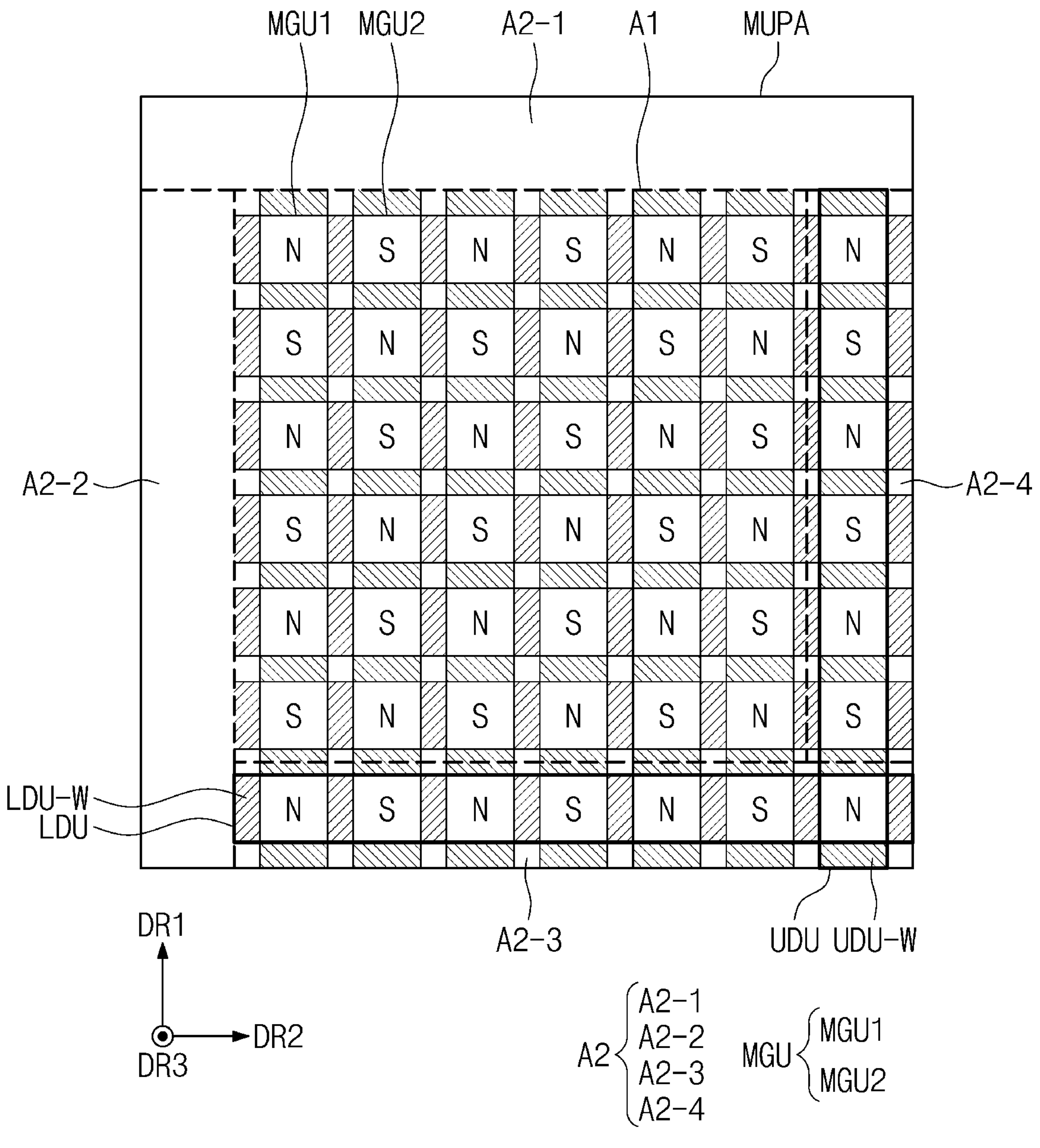
FIG. 6A is a plan view of a portion of a deposition apparatus according to an embodiment of the disclosure.

Referring to FIG. 6A, for the convenience of explanation, the lower driving unit LDU closest to the second-third area A2-3 will be referred to as a first lower driving unit LDU, and the lower driving units LDU sequentially arranged from the first lower driving unit LDU to the first direction DR1 will be respectively referred to as second, third, fourth, fifth, sixth, and seventh lower driving units LDU. In FIG. 6A, an area corresponding to the first lower driving unit LDU is shown by a bold solid line. The magnet units MGU overlapping an n-th lower driving unit LDU in a plan view among the first to seventh lower driving units LDU will be referred to as n-th row magnet units MGU.

For the convenience of explanation, the upper driving unit UDU disposed closest to the second-fourth area A2-4 will be referred to as a first upper driving unit UDU, and the upper driving units UDU sequentially arranged from the first upper driving unit UDU to a direction opposite to the second direction DR2 will be respectively referred to as second, third, fourth, fifth, sixth, and seventh upper driving units UDU. In FIG. 6A, an area corresponding to the first upper driving unit UDU is shown by a bold solid line. The magnet units MGU overlapping an m-th upper driving unit UDU in a plan view among the first to seventh upper driving units UDU will be referred to as m-th column magnet units MGU.

FIG. 6A shows seven upper driving units UDU and seven lower driving units LDU as an embodiment, however, the number of the upper driving units and the number of the lower driving units, which are disposed on the magnet unit placement plane MUAP, should not be limited thereto or thereby. The number of the upper driving units UDU may be different from the number of the lower driving units LDU.

FIGS. 6A to 6F show polarities of the magnet units MGU only on a surface adjacent to the second plate PT2 (refer to FIG. 5B), and forty-nine magnet units MGU are illustrated. However, this is merely an embodiment, and the number of the magnet units MGU should not be limited thereto or thereby.

The upper driving units UDU and the lower driving units LDU may operate in multiple modes to change the arrangement of the magnet units MGU. For example, the upper driving units UDU and the lower driving units LDU may operate in a first mode, a second mode, and a third mode.

FIG. 6A shows the arrangement of the magnet units MGU, which corresponds to the first mode. Referring to FIG. 6A, the first mode may correspond to a basic state before the masks MM (refer to FIG. 3) are provided in the deposition apparatus PDA (refer to FIG. 3). In the first mode, the first to seventh upper driving units UDU may be aligned in the second direction DR2, and the first to seventh lower driving units LDU may be aligned in the first direction DR1.

In the first mode, the first magnet units MGU1 and the second magnet units MGU2 may be alternately arranged in the first direction DR1 and the second direction DR2. For example, a first row magnet unit MGU may include the first magnet units MGU1 and the second magnet units MGU2 alternately arranged with the first magnet units MGU1 in the second direction DR2. A first column magnet unit MGU may include the first magnet units MGU1 and the second magnet units MGU2 alternately arranged with the first magnet units MGU1 in the first direction DR1.

The arrangement of the magnet units MGU may be changed by moving the upper driving units UDU or the lower driving units LDU. For example, the upper driving units UDU or the lower driving units LDU may move according to the extension direction of the masks MM (refer to FIG. 1) provided corresponding to the first area A1, and thus, the alignment direction of the magnet units MGU may be changed. FIGS. 6B to 6F show the arrangement of the magnet units MGU according to the movement of the upper driving units UDU or the lower driving units LDU, and the upper driving units UDU or lower driving units LDU after being moved are schematically shown by a bold solid line.

Figure 6B:
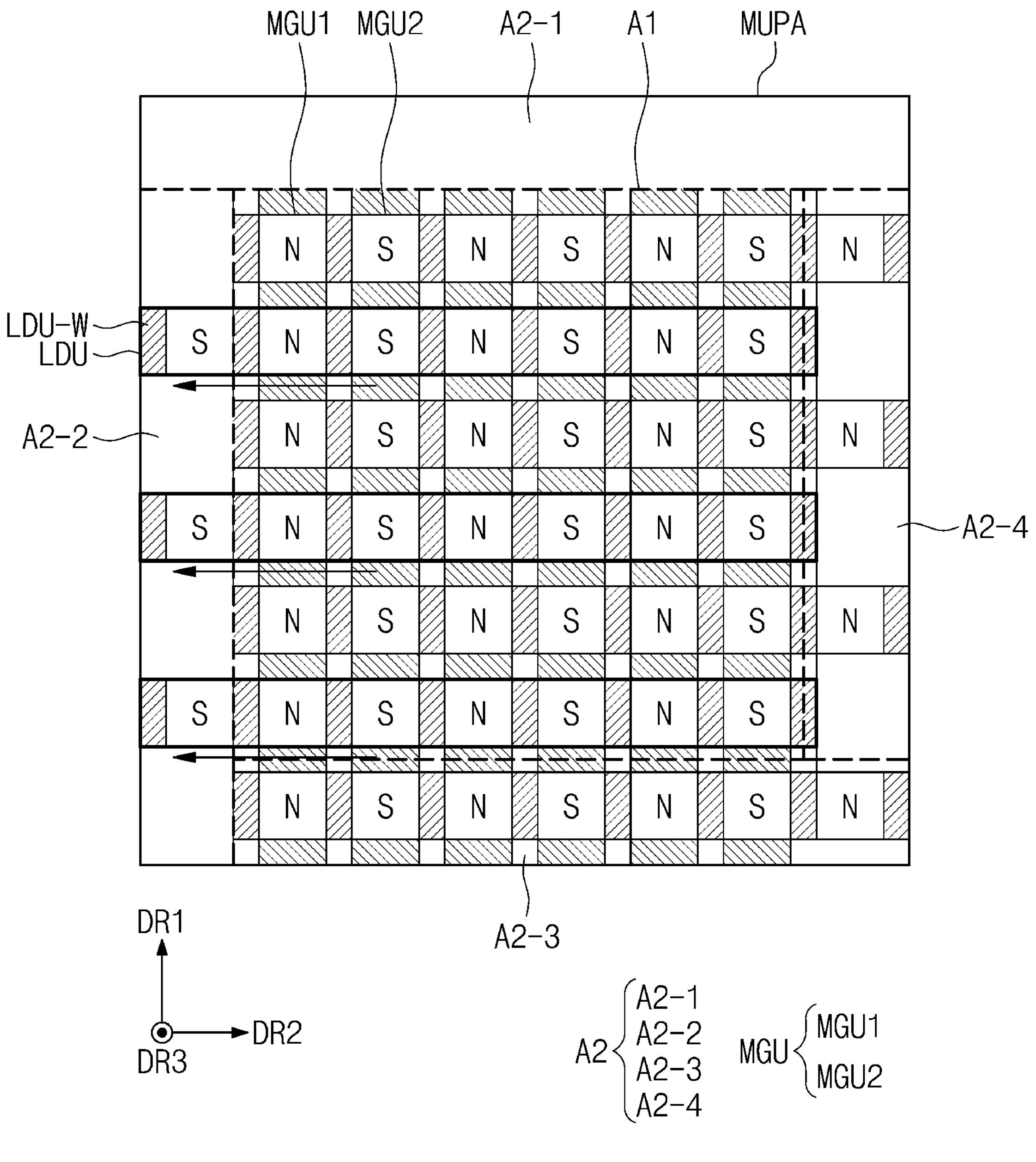
FIG. 6B is a plan view of a portion of a deposition apparatus according to an embodiment of the disclosure.
Figure 6C:
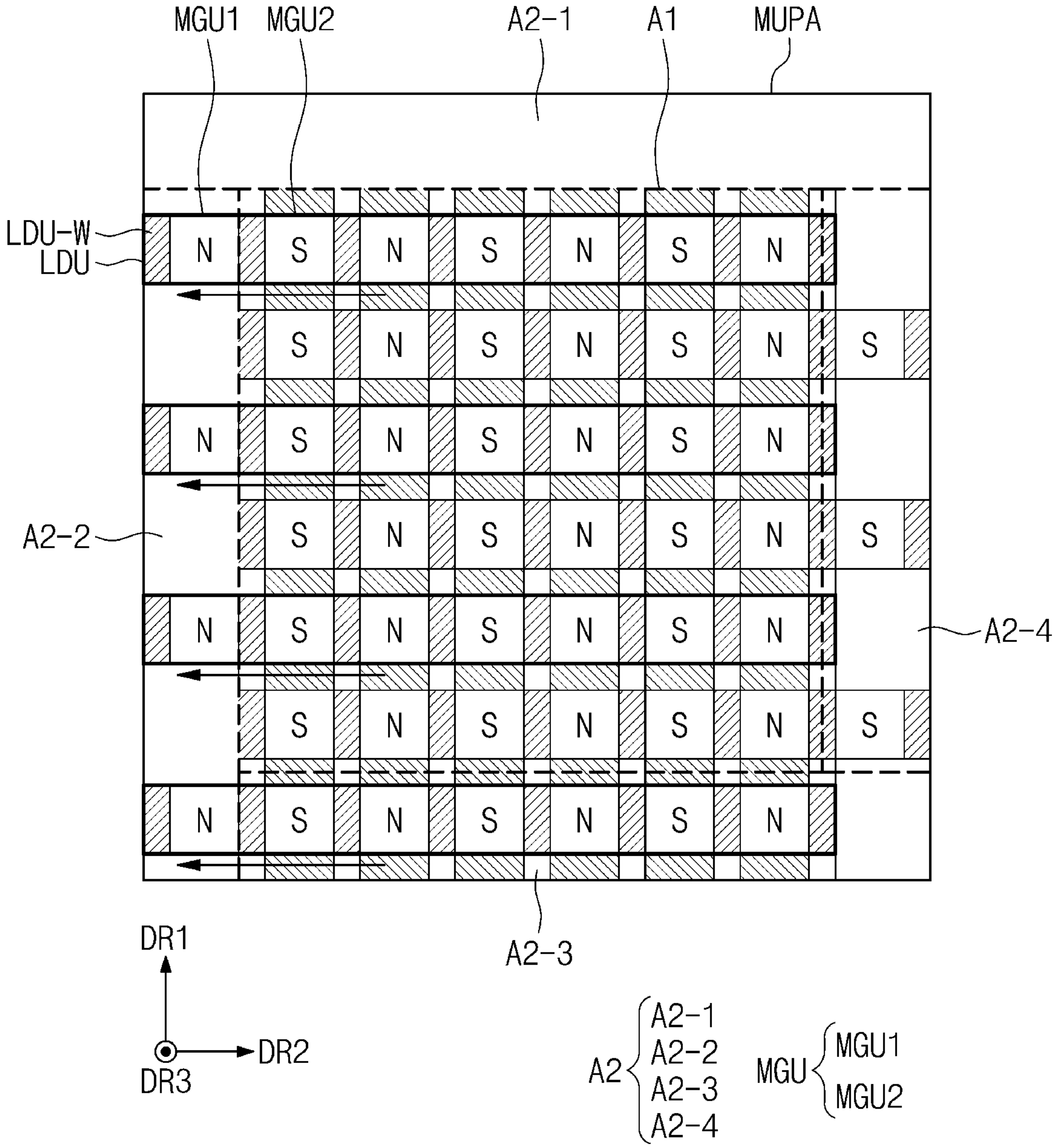
FIG. 6C is a plan view of a portion of a deposition apparatus according to an embodiment of the disclosure.

FIGS. 6B and 6C show the arrangement of the magnet units MGU in case that the first mode is changed to the third mode.

Referring to FIG. 6B, even-numbered lower driving units LDU of the first to seventh lower driving units LDU may move in a direction parallel to the second direction DR2 in the process of changing the first mode to the third mode. For example, the second, fourth, and sixth lower driving units LDU may move in a direction opposite to the second direction DR2, however, this is merely an embodiment. According to an embodiment, the second, fourth, and sixth lower driving units LDU may move in the second direction DR2 according to the magnet unit placement plane MUAP.

As the second, fourth, and sixth lower driving units LDU move in the direction opposite to the second direction DR2, the lower barrier walls LDU-W of the second, fourth, and sixth lower driving units LDU may apply a force to push the second, fourth, and sixth row magnet units MGU to the direction opposite to the second direction DR2. As a result, the arrangement of the second, fourth, and sixth row magnet units MGU may be changed to the direction opposite to the second direction DR2. Accordingly, the magnet units MGU disposed at a leftmost position of the second, fourth, and sixth row magnet units MGU disposed in the first area A1 in the first mode may overlap the second-second area A2-2 in the third mode.

In the third mode according to the movement of the second, fourth, and sixth lower driving units LDU, the magnet units MGU arranged in odd-numbered columns may include the first magnet units MGU1, and the magnet units MGU arranged in even-numbered columns may include the second magnet units MGU2. For example, the first magnet units MGU1 may correspond to first, third, fifth, and seventh column magnet units MGU, and the second magnet units MGU2 may correspond to the second, fourth, and sixth column magnet units MGU.

In the third mode, the first magnet units MGU1 may be alternately arranged with the second magnet units MGU2 in the second direction DR2. For example, each of the first to seventh row magnet units MGU respectively overlapping the first to seventh lower driving units LDU may correspond to the first magnet units MGU1 and the second magnet units MGU2 alternately arranged with the first magnet units MGU1 in the second direction DR2.

Referring to FIG. 6C, in the process of changing the first mode to the third mode, odd-numbered lower driving units LDU of the first to seventh lower driving units LDU may move in a direction parallel to the second direction DR2. For example, the first, third, fifth, and seventh lower driving units LDU may move in a direction opposite to the second direction DR2, however, this is merely an embodiment. According to an embodiment, the first, third, fifth, and seventh lower driving units LDU may move in the second direction DR2 according to the magnet unit placement plane MUAP.

As the first, third, fifth, and seventh lower driving units LDU move in the direction opposite to the second direction DR2, the lower barrier walls LDU-W of the first, third, fifth, and seventh lower driving units LDU may apply a force to push the first, third, fifth, and seventh row magnet units MGU to the direction opposite to the second direction DR2. As a result, the arrangement of the first, third, fifth, and seventh row magnet units MGU may be changed to the direction opposite to the second direction DR2. Accordingly, the magnet units MGU disposed at a leftmost position of the first, third, fifth, and seventh row magnet units MGU, which are disposed in the first area A1 in the first mode, may overlap the second-second area A2-2 in the third mode.

In the third mode according to the movement of the first, third, fifth, and seventh lower driving units LDU, the magnet units MGU arranged in the odd-numbered columns may include the second magnet units MGU2, and the magnet units MGU arranged in the even-numbered columns may include the first magnet units MGU1. For example, the second magnet units MGU2 may correspond to the first, third, fifth, and seventh column magnet units MGU, and the first magnet units MGU1 may correspond to the second, fourth, and sixth column magnet units MGU.

In the third mode, the first magnet units MGU1 may be alternately arranged with the second magnet units MGU2 in the second direction DR2. For example, each of the first to seventh row magnet units MGU respectively overlapping the first to seventh lower driving units LDU may correspond to the first magnet units MGU1 and the second magnet units MGU2 alternately arranged with the first magnet units MGU1 in the second direction DR2.

Referring to FIGS. 6B and 6C, the magnet units MGU having a same polarity direction may be aligned in first direction DR1 in the third mode For example, the alignment direction of the magnet units MGU may correspond to the first direction DR1 in the third mode. In case that the extension direction of the masks MM (refer to FIG. 1) provided corresponding to the first area A1 is parallel to the second direction DR2, the lower driving units LDU may move to allow the magnet units MGU to be aligned in the third mode. As the alignment direction of the magnet units MGU intersects the extension direction of the masks MM (refer to FIG. 1), the repulsive force that partially occurs between the masks MM (refer to FIG. 1) and the magnet units MGU may be prevented.

Figure 6D:
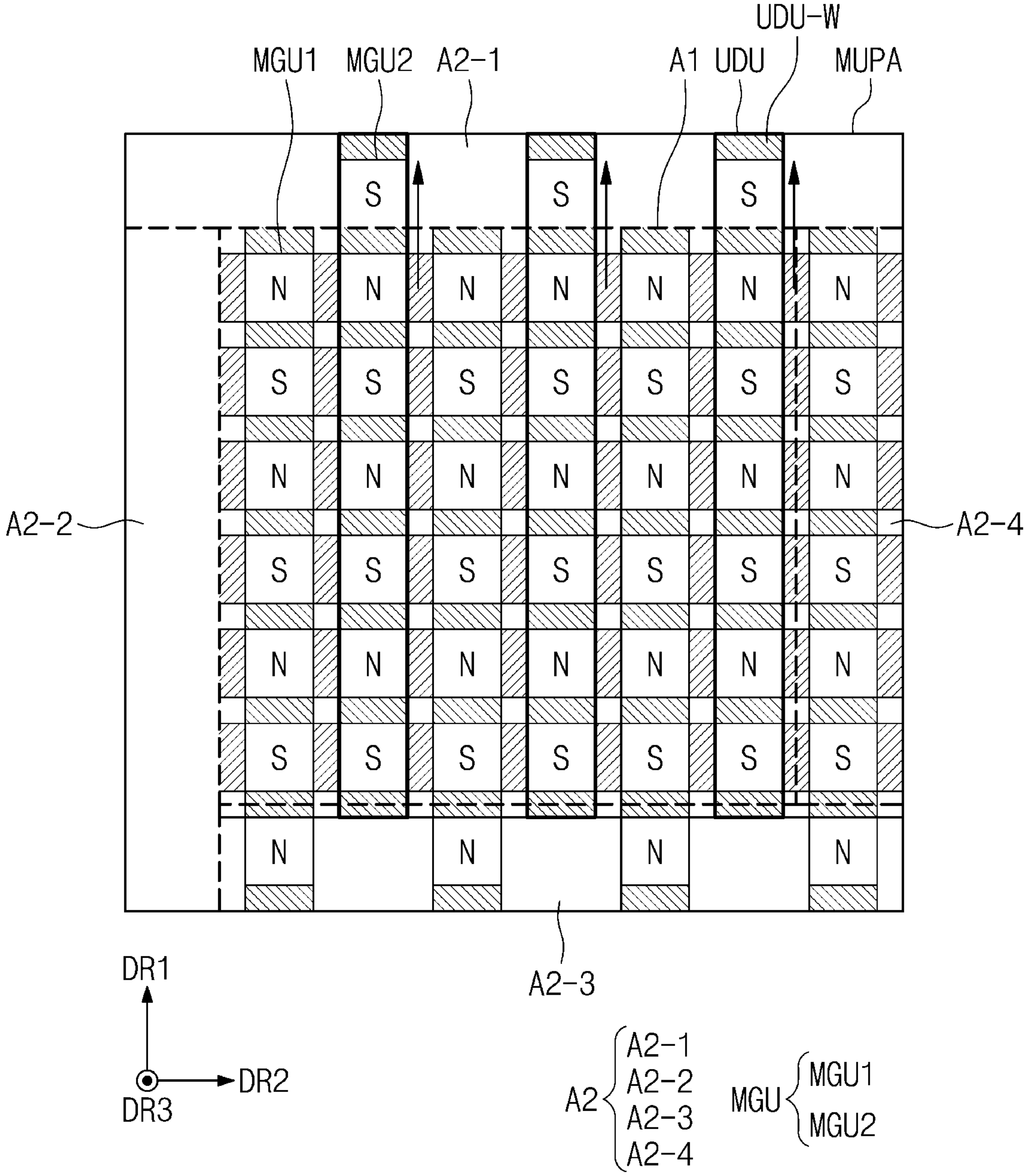
FIG. 6D is a plan view of a portion of a deposition apparatus according to an embodiment of the disclosure.
Figure 6E:
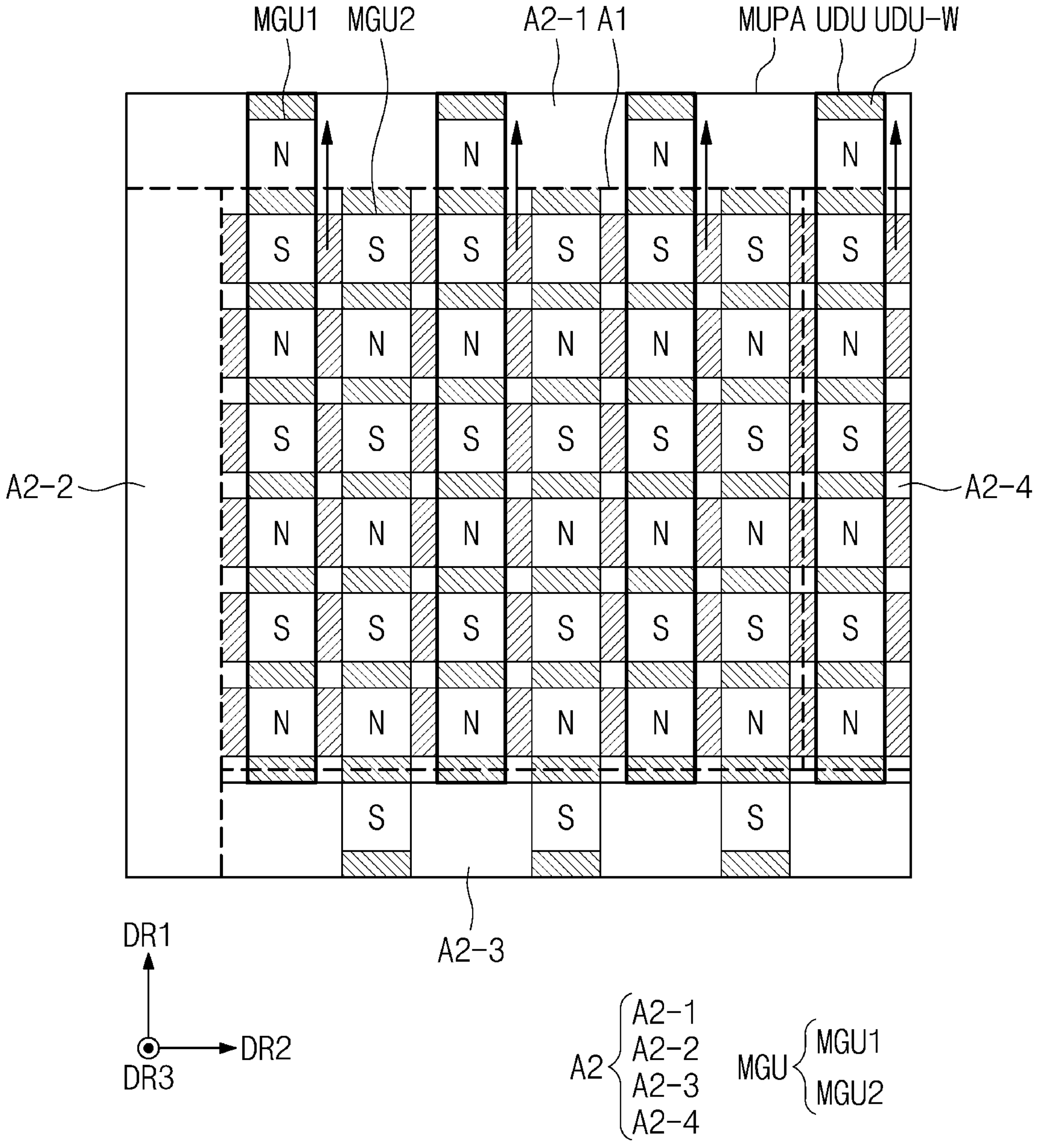
FIG. 6E is a plan view of a portion of a deposition apparatus according to an embodiment of the disclosure.

FIGS. 6D and 6E show the arrangement of the magnet units MGU in case that the first mode is changed to the second mode.

Referring to FIG. 6D, even-numbered upper driving units UDU of the first to seventh upper driving units UDU may move in a direction parallel to the first direction DR1 in the process of changing the first mode to the second mode. For example, the second, fourth, and sixth upper driving units UDU may move in the first direction DR1, however, this is merely an embodiment. According to an embodiment, the second, fourth, and sixth upper driving units UDU may move according to the magnet unit placement plane MUAP in a direction opposite to the first direction DR1.

As the second, fourth, and sixth upper driving units UDU move in the first direction DR1, the upper barrier walls UDU-W of the second, fourth, and sixth upper driving units UDU may apply a force to push the second, fourth, and sixth row magnet units MGU in the first direction DR1. As a result, the arrangement of the second, fourth, and sixth row magnet units MGU may be changed to the first direction DR1. Accordingly, the magnet units MGU disposed at an uppermost position of the second, fourth, and sixth row magnet units MGU disposed in the first area A1 in the first mode may overlap the second-first area A2-1 in the second mode.

In the second mode according to the movement of the second, fourth, and sixth upper driving units UDU, the magnet units MGU arranged in odd-numbered rows may include the first magnet units MGU1, and the magnet units MGU arranged in even-numbered rows may include the second magnet units MGU2. For example, the first magnet units MGU1 may correspond to the first, third, fifth, and seventh row magnet units MGU, and the second magnet units MGU2 may correspond to the second, fourth, and sixth row magnet units MGU.

In the second mode, the first magnet units MGU1 may be alternately arranged with the second magnet units MGU2 in the first direction DR1. For example, each of the first to seventh row magnet units MGU respectively overlapping the first to seventh upper driving units UDU may correspond to the first magnet units MGU1 and the second magnet units MGU2 alternately arranged with the first magnet units MGU1 in the first direction DR1.

Referring to FIG. 6E, odd-numbered upper driving units UDU among the first to seventh upper driving units UDU may move in a direction parallel to the first direction DR1 in the process of changing the first mode to the second mode. For example, the first, third, fifth, and seventh upper driving units UDU may move in the first direction DR1, however, this is merely an embodiment. According to an embodiment, the first, third, fifth, and seventh upper driving units UDU may move according to the magnet unit placement plane MUAP in a direction opposite to the first direction DR1.

As the first, third, fifth, and seventh upper driving units UDU move in the first direction DR1, the upper barrier walls UDU-W of the first, third, fifth, and seventh upper driving units UDU may apply a force to push the first, third, fifth, and seventh column magnet units MGU in the first direction DR1. As a result, the arrangement of the first, third, fifth, and seventh column magnet units MGU may be changed to the first direction DR1. Accordingly, the magnet units MGU disposed at an uppermost position of the first, third, fifth, and seventh column magnet units MGU disposed in the first area A1 in the first mode may overlap the second-first area A2-1 in the second mode.

In the second mode according to the movement of the first, third, fifth, and seventh upper driving units UDU, the magnet units MGU of the odd-numbered rows may include the second magnet units MGU2, and the magnet units MGU of the even-numbered rows may include the first magnet units MGU1. For example, the second magnet units MGU2 may correspond to the first, third, fifth, and seventh row magnet units MGU, and the first magnet units MGU1 may correspond to the second, fourth, and sixth row magnet units MGU.

In the second mode, the first magnet units MGU1 may be alternately arranged with the second magnet units MGU2 in the first direction DR1. For example, each of the first to seventh row magnet units MGU respectively overlapping the first to seventh upper driving units UDU may correspond to the first magnet units MGU1 and the second magnet units MGU2 alternately arranged with the first magnet units MGU1 in the first direction DR1.

Referring to FIGS. 6D and 6E, the magnet units MGU may be aligned to have a same polarity direction in second direction DR2 in the second mode. For example, the alignment direction of the magnet units MGU may correspond to the second direction DR2 in the second mode. In case that the extension direction of the masks MM (refer to FIG. 1) provided corresponding to the first area A1 is parallel to the first direction DR1, the upper driving units UDU may move to allow the magnet units MGU to be aligned in the second mode. As the alignment direction of the magnet units MGU intersects the extension direction of the masks MM (refer to FIG. 1), the repulsive force that partially occurs between the masks MM (refer to FIG. 1) and the magnet units MGU may be prevented.

Figure 6F:
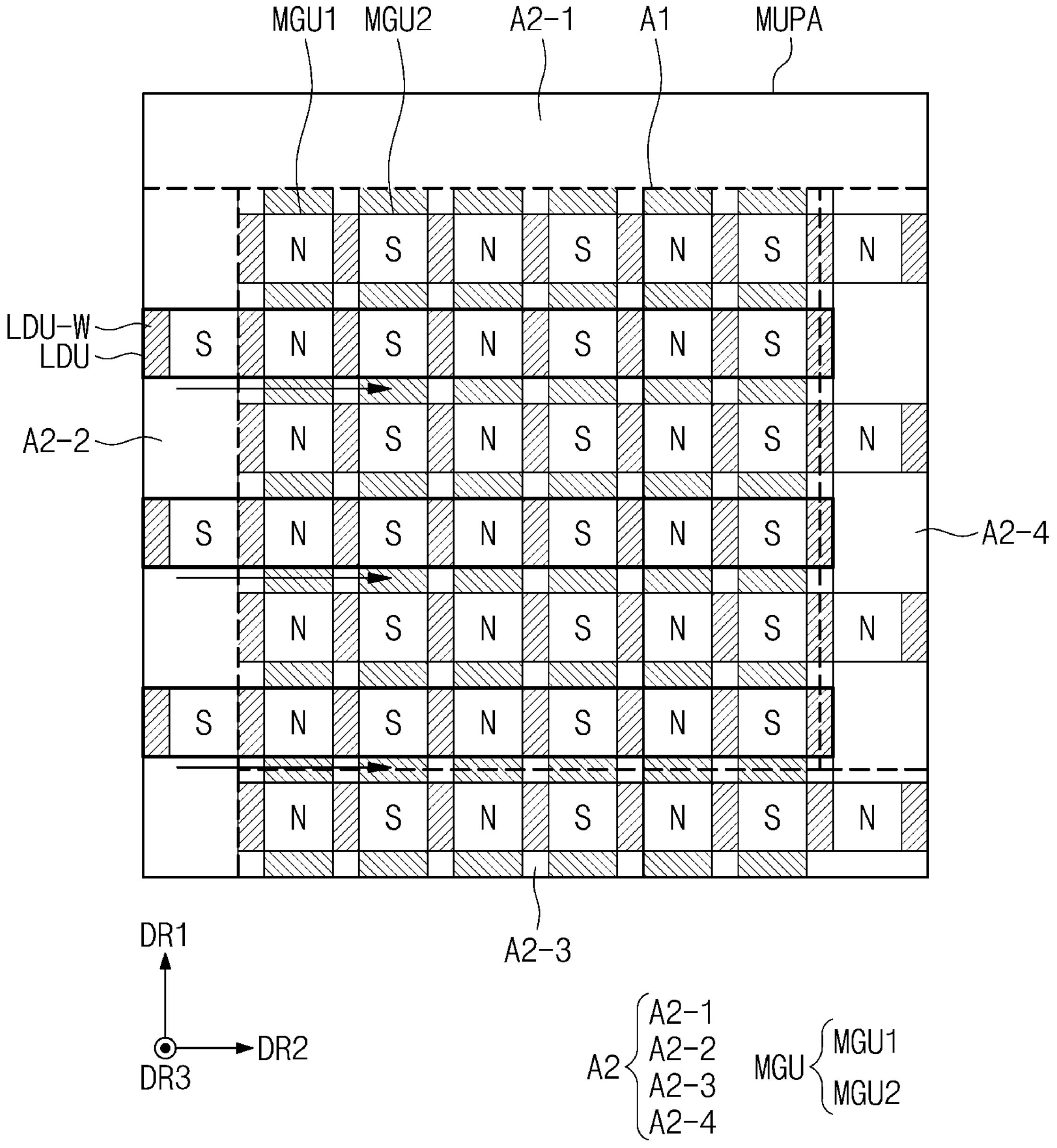
FIG. 6F is a plan view of a portion of a deposition apparatus according to an embodiment of the disclosure.

FIG. 6F schematically shows the movement of the lower driving units LDU to change the operation mode from the third mode to the first mode. FIG. 6F shows the state corresponding to the third mode transited from the first mode by moving the second, fourth, and sixth lower driving units LDU in a direction opposite to the second direction DR2. Referring to FIG. 6F, the second, fourth, and sixth lower driving units LDU may move in the second direction DR2 to change the third mode to the first mode again. After the second, fourth, and sixth lower driving units LDU of FIG. 6F move in the second direction DR2, the arrangement of the magnet units MGU may correspond to the arrangement of the magnet units MGU shown in FIG. 6A.

Similarly, in case that the upper driving units UDU or the lower driving units LDU, which previously moved, are moved again in a direction opposite to the previous movement direction to switch the operation mode, the arrangement of the magnet units MGU may be changed to the first mode (refer to FIG. 6A). In the state where the arrangement of the magnet units MGU corresponds to the first mode, the second mode or the third mode may be selected according to the extension direction of the masks MM (refer to FIG. 1) provided to the deposition apparatus PDA (refer to FIG. 1) to move the upper driving units UDU or the lower driving units LDU. The arrangement of the magnet units MGU may be readily changed to the first mode, the second mode, and the third mode using the upper driving units UDU and the lower driving units LDU.

Figure 7A:
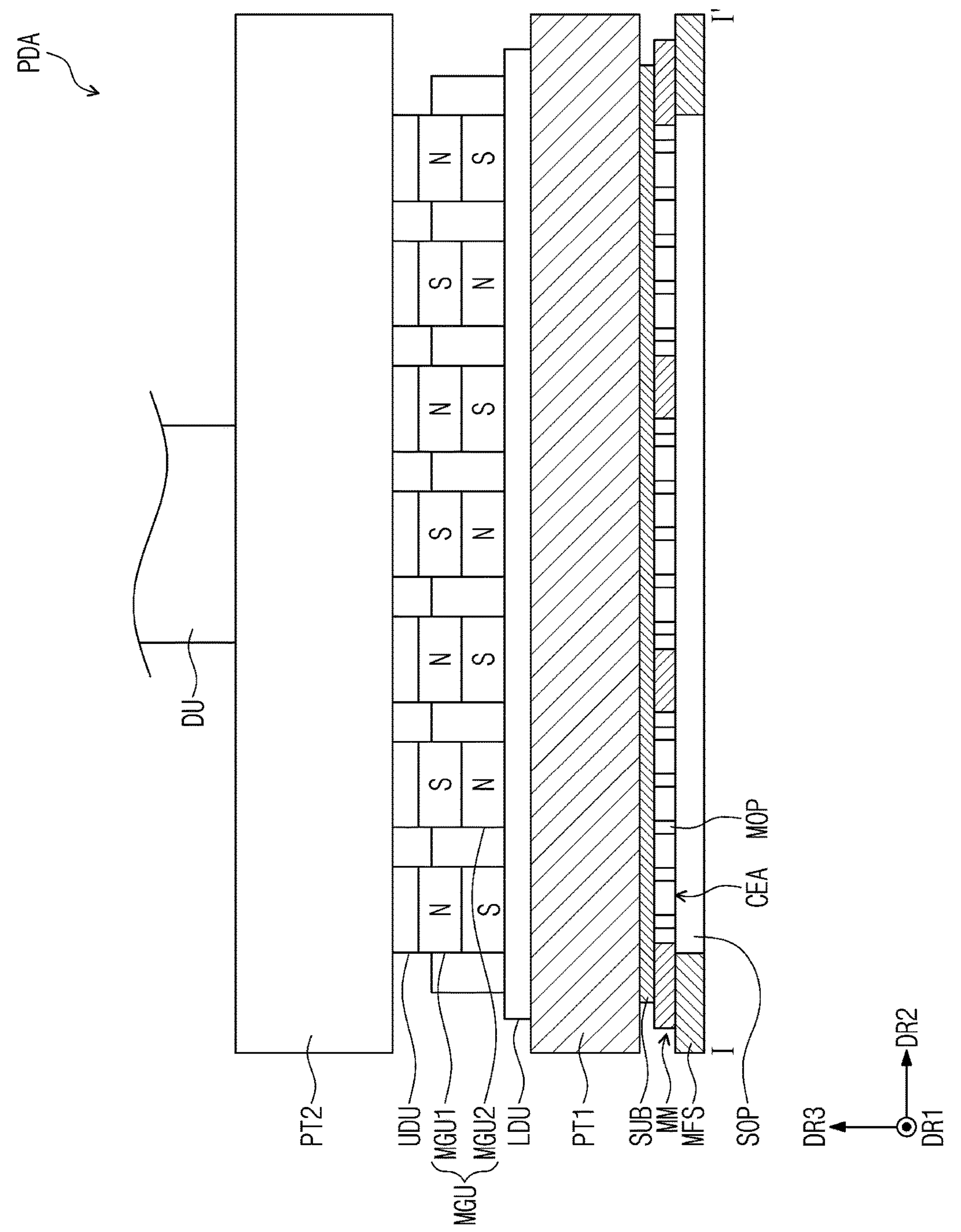
FIG. 7A is a schematic cross-sectional view of a portion of a deposition apparatus according to an embodiment of the disclosure.
Figure 7B:
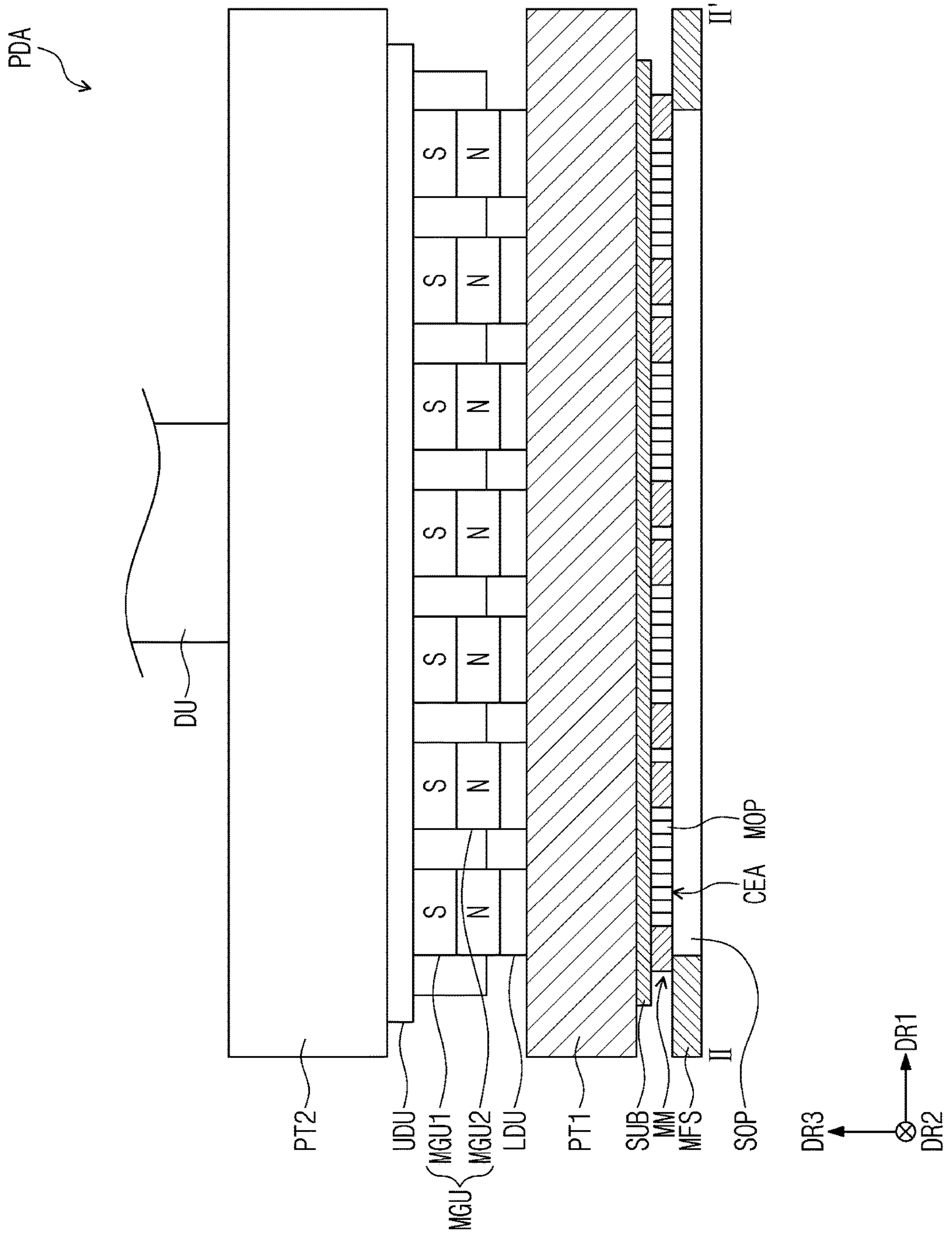
FIG. 7B is a schematic cross-sectional view of a portion of a deposition apparatus according to an embodiment of the disclosure.

FIGS. 7A and 7B are schematic cross-sectional views of the deposition apparatus PDA according to an embodiment of the disclosure.

FIG. 7A is a schematic cross-sectional view of the deposition apparatus PDA taken along line I-I' of FIG. 1. FIG. 7B is a schematic cross-sectional view of the deposition apparatus PDA taken along line II-II' of FIG. 1. However, different from the embodiment shown in FIG. 3, the arrangement of the magnet units MGU shown in FIGS. 7A and 7B may correspond to the third mode obtained by moving some of the lower driving units LDU (refer to FIGS. 6B and 6C).

Referring to FIGS. 7A and 7B, the extension direction of the masks MM disposed in the deposition apparatus PDA may be substantially parallel to the second direction DR2. The lower driving units LDU may move the magnet units MGU to allow the alignment direction of the magnet units MGU to be parallel to the first direction DR1 in consideration of the extension direction of the masks MM. As a result, the repulsive force that partially occurs between the masks MM and the magnet units MGU may be prevented, and the substrate SUB may be tightly attached to the masks MM to prevent the substrate SUB from being detached.

Similarly, the extension direction of the masks MM disposed in the deposition apparatus PDA may be substantially parallel to the first direction DR1, and the upper driving units UDU may move the magnet units MGU to allow the alignment direction of the magnet units MGU to be parallel to the second direction DR2 as shown in FIGS. 6D and 6F. As a result, the repulsive force that partially occurs between the masks MM and the magnet units MGU may be prevented, and the substrate SUB may be tightly attached to the masks MM to prevent the substrate SUB from being detached.

As described above, the alignment of the magnet units MGU may be changed readily and quickly according to the various shape of the masks MM. Accordingly, defects in deposition of the substrate SUB may be prevented, and time and cost required for the deposition process may be reduced. As the reliability of the deposition process is improved, and the reliability of the display panel manufactured by the deposition process may be improved.

Figure 8:
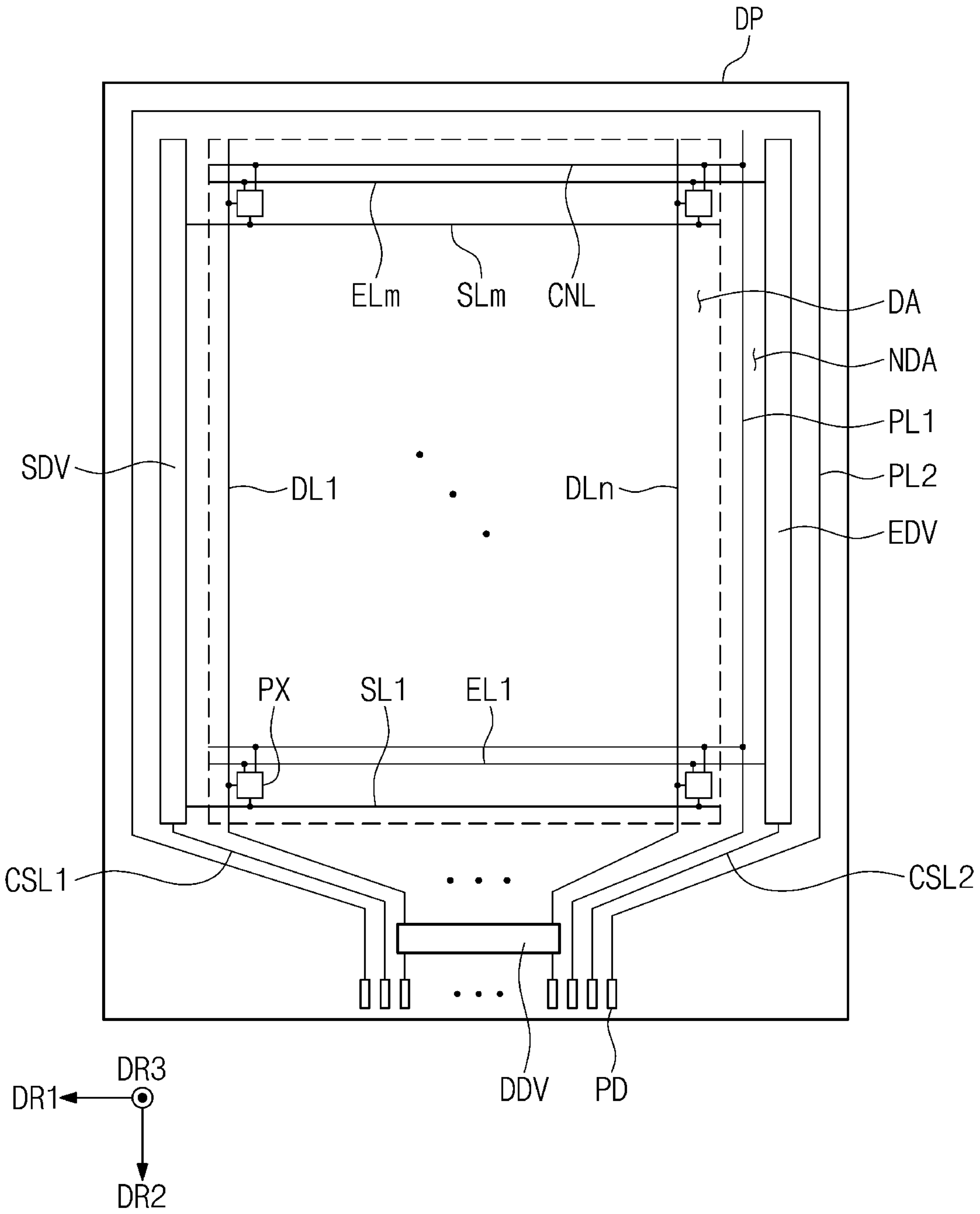
FIG. 8 is a plan view of a display panel manufactured using a deposition apparatus according to an embodiment of the disclosure.

FIG. 8 is a plan view of a display panel manufactured using the deposition apparatus PDA (refer to FIG. 1) according to an embodiment of the disclosure.

Referring to FIG. 8, the display panel DP may have a rectangular shape in a plan view defined by short sides extending in the first direction DR1 and long sides extending in the second direction DR2, however, the shape of the display panel DP should not be limited to the rectangular shape. The display panel DP may include a display part DA and a non-display part NDA adjacent to (e.g., surrounding) the display part DA.

The display panel DP may be a light emitting type display panel. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as an embodiment of the display panel DP.

The display panel DP may include multiple pixels PX, multiple scan lines SL1 to SLm, multiple data lines DL1 to DLn, multiple emission lines EL1 to Elm, first and second control lines CSL1 and CSL2, first and second power lines PL1 and PL2, connection lines CNL, and multiple pads PD. Each of “m” and “n” may be a natural number.

The pixels PX may be arranged in the display part DA. A scan driver SDV and an emission driver EDV may be disposed in the non-display part NDA respectively adjacent to the long sides of the display panel DP. A data driver DDV may be disposed in the non-display part NDA adjacent to one of the short sides of the display panel DP. In a plan view, the data driver DDV may be disposed adjacent to a lower end of the display panel DP.

The scan lines SL1 to SLm may extend in the first direction DR1 and may be connected to the pixels PX and the scan driver SDV. The data lines DL1 to DLn may extend in the second direction DR2 and may be connected to the pixels PX and the data driver DDV. The emission lines EL1 to Elm may extend in the direction parallel to the first direction DR1 and may be connected to the pixels PX and the emission driver EDV.

The first power line PL1 may extend in the second direction DR2 and may be disposed in the non-display part NDA. The first power line PL1 may be disposed between the display part DA and the emission driver EDV, however, the disclosure should not be limited thereto or thereby. According to an embodiment, the first power line PL1 may be disposed between the display part DA and the scan driver SDV.

The connection lines CNL may extend in the first direction DR1 and may be arranged in the second direction DR2. The connection lines CNL may be connected to the first power line PL1 and the pixels PX. A first voltage may be applied to the pixels PX through the first power line PL1 and the connection lines CNL connected to the first power line PL1.

The second power line PL2 may be disposed in the non-display part NDA. The second power line PL2 may extend along the long sides of the display panel DP and another short side at which the data driver DDV is not disposed in the display panel DP. The second power line PL2 may be disposed outside the scan driver SDV and the emission driver EDV.

Although not shown in drawings, the second power line PL2 may extend to the display part DA and may be connected to the pixels PX. A second voltage having a level lower than the first voltage may be applied to the pixels PX through the second power line PL2.

The first control line CSL1 may be connected to the scan driver SDV and may extend toward the lower end of the display panel DP in a plan view. The second control line CSL2 may be connected to the emission driver EDV and may extend toward the lower end of the display panel DP in a plan view. The data driver DDV may be disposed between the first control line CSL1 and the second control line CSL2.

The pads PD may be disposed on the display panel DP. The pads PD may be disposed closer to the lower end of the display panel DP than the data driver DDV is. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Although not shown in drawings, a timing controller to control an operation of the scan driver SDV, the data driver DDV, and the emission driver EDV and a voltage generator to generate the first and second voltages may be disposed on a printed circuit board. The timing controller and the voltage generator may be connected to corresponding pads PD through the printed circuit board.

The scan driver SDV may generate multiple scan signals, and the scan signals may be applied to the pixels PX through the scan lines SL1 to SLm. The data driver DDV may generate multiple data voltages, and the data voltages may be applied to the pixels PX through the data lines DL1 to DLn. The emission driver EDV may generate multiple emission signals, and the emission signals may be applied to the pixels PX through the emission lines EL1 to Elm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals.

Figure 9:
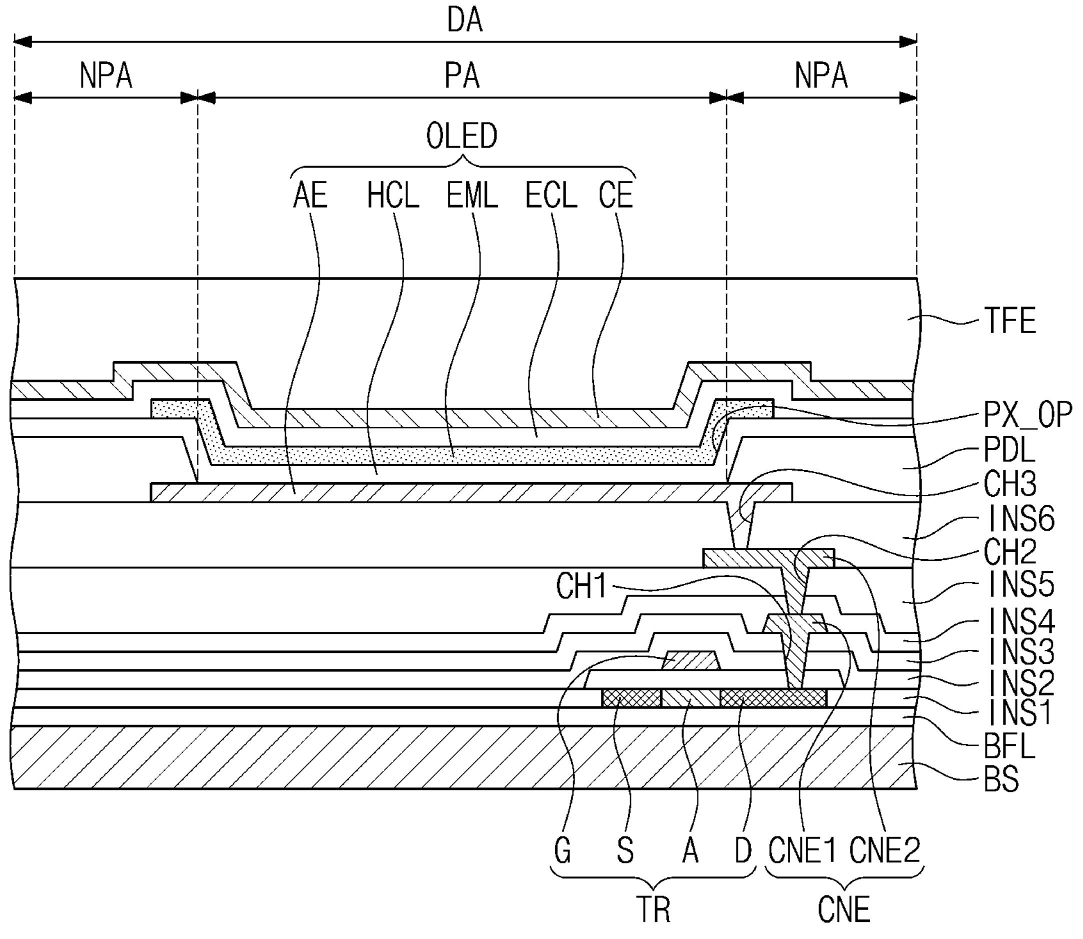
FIG. 9 is a schematic cross-sectional view of a pixel shown in FIG. 8.

FIG. 9 is a schematic cross-sectional view of the pixel shown in FIG. 8.

Referring to FIGS. 8 and 9, the pixel PX may be disposed on a base substrate BS and may include a transistor TR and a light emitting element OLED. For example, one transistor TR is shown in FIG. 9, however, the pixel PX may include multiple transistors and at least one capacitor to drive the light emitting element OLED.

The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode.

The display part DA may include a light emitting area PA corresponding to each pixel PX and a non-light-emitting area NPA around the light emitting area PA. The light emitting element OLED may be disposed in the light emitting area PA.

The base substrate BS may include a flexible plastic substrate. For example, the base substrate BS may include transparent polyimide (PI). A buffer layer BFL may be disposed on the base substrate BS, and the buffer layer BFL may be an inorganic layer.

A semiconductor pattern may be disposed on the buffer layer BFL. The semiconductor pattern may include polycrystalline silicon, however, the disclosure should not be limited thereto or thereby. According to an embodiment, the semiconductor pattern may include amorphous silicon or a metal oxide.

The semiconductor pattern may be doped with an N-type dopant or a P-type dopant. The semiconductor pattern may include a high-doped region and a low-doped region. The high-doped region may have a conductivity greater than a conductivity of the low-doped region and may substantially serve as a source electrode and a drain electrode of the transistor TR. The low-doped region may substantially correspond to an active (or a channel) of the transistor TR.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. The gate G may overlap the active A in a plan view. A second insulating layer INS2 may be disposed on the gate G. A third insulating layer INS3 may be disposed on the second insulating layer INS2.

A connection electrode CNE may be disposed between the transistor TR and the light emitting element OLED to connect the transistor TR to the light emitting element OLED. The connection electrode CNE may include a first connection electrode CNE1 and a second connection electrode CNE2.

The first connection electrode CNE1 may be disposed on the third insulating layer INS3 and may be connected to the drain D via a first contact hole CH1 defined through the first, second, and third insulating layers INS1, INS2, and INS3. A fourth insulating layer INS4 may be disposed on the first connection electrode CNE1. A fifth insulating layer INS5 may be disposed on the fourth insulating layer INS4.

The second connection electrode CNE2 may be disposed on the fifth insulating layer INS5. The second connection electrode CNE2 may be connected to the first connection electrode CNE1 via a second contact hole CH2 defined through the fourth insulating layer INS4 and the fifth insulating layer INS5. A sixth insulating layer INS6 may be disposed on the second connection electrode CNE2. Each of the first to sixth insulating layers INS1 to INS6 may be an inorganic layer or an organic layer.

The first electrode AE may be disposed on the sixth insulating layer INS6. The first electrode AE may be connected to the second connection electrode CNE2 via a third contact hole CH3 defined through the sixth insulating layer INS6. A pixel definition layer PDL may be disposed on the first electrode AE and the sixth insulating layer INS6 to expose a portion of the first electrode AE. The pixel definition layer PDL may be provided with an opening PX_OP defined therethrough to expose the portion of the first electrode AE.

The hole control layer HCL may be disposed on the first electrode AE and the pixel definition layer PDL. The hole control layer HCL may be commonly disposed in the light emitting area PA and the non-light-emitting area NPA. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate a light having one of red, green, and blue colors.

The electron control layer ECL may be disposed on the light emitting layer EML and the hole control layer HCL. The electron control layer ECL may be commonly disposed in the light emitting area PA and the non-light-emitting area NPA. The electron control layer ECL may include an electron transport layer and an electron injection layer.

The second electrode CE may be disposed on the electron control layer ECL. The second electrode CE may be commonly disposed over the pixels PX. Each layer from the buffer layer BFL to the light emitting element OLED may be referred to as a pixel layer.

A thin film encapsulation layer TFE may be disposed on the light emitting element OLED. The thin film encapsulation layer TFE may be disposed on the second electrode CE and cover the pixel PX. The thin film encapsulation layer TFE may include at least two inorganic layers and an organic layer disposed between the inorganic layers. The inorganic layers may protect the pixel PX from moisture and oxygen. The organic layer may protect the pixel PX from a foreign substance such as dust particles.

The first voltage may be applied to the first electrode AE via the transistor TR, and the second voltage having the level lower than the first voltage may be applied to the second electrode CE. Holes and electrons injected into the light emitting layer EML may be recombined to generate excitons, and the light emitting element OLED may emit the light by the excitons that return to a ground state from an excited state.

Figure 10:
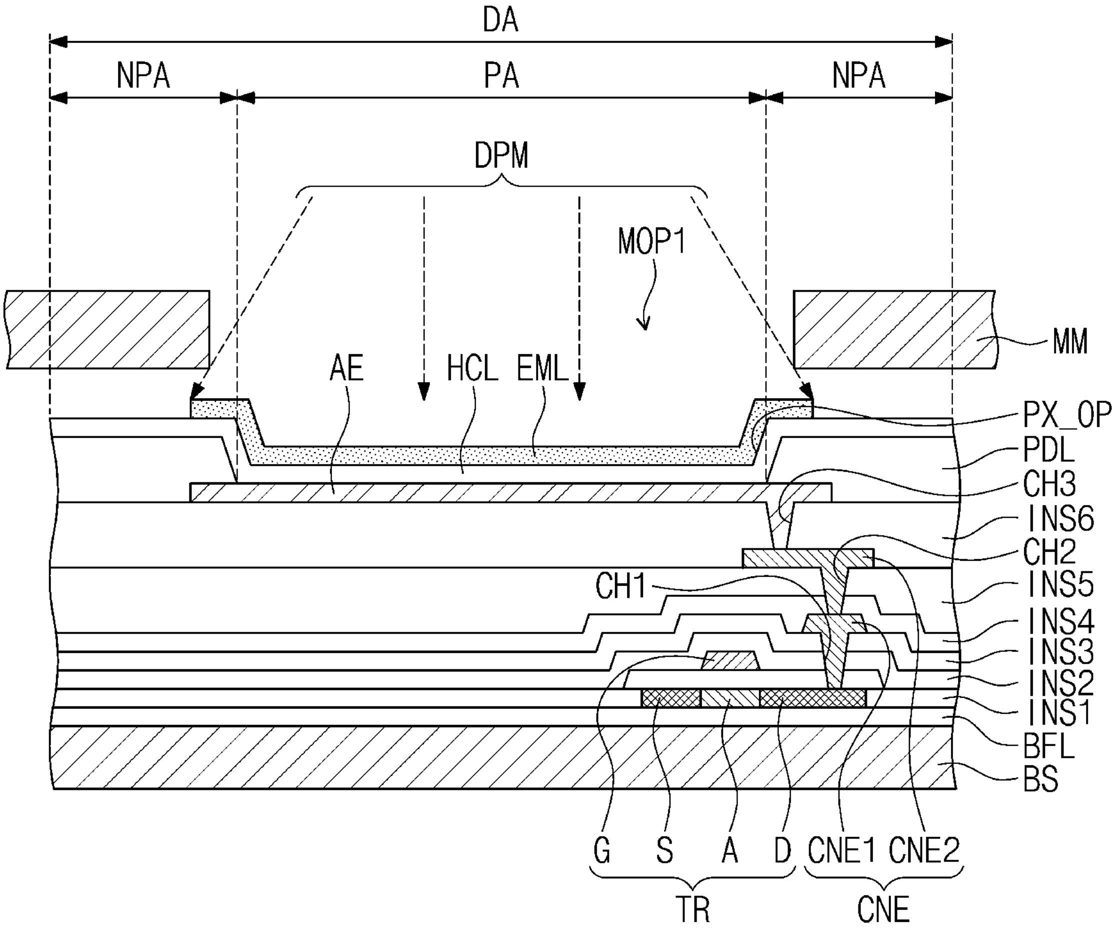
FIG. 10 is schematic a cross-sectional view illustrating a deposition process of a display panel shown in FIG. 9.

FIG. 10 is a schematic cross-sectional view illustrating the deposition process of the display panel shown in FIG. 9.

The layers from the base substrate BS to the first electrode AE may correspond to the substrate SUB (refer to FIG. 1), however, the disclosure should not be limited thereto or thereby. According to an embodiment, components of the substrate SUB (refer to FIG. 1) may vary depending on an object to be formed through the deposition process.

The masks MM may be disposed to face the substrate SUB (refer to FIG. 1) to form the light emitting layer EML through the deposition process. The masks MM may be disposed adjacent to the substrate SUB.

The deposition material DPM may be a gaseous material used in the deposition process of the display panel. For example, the deposition material DPM may be a gaseous material forming the light emitting layer EML of a display device. The deposition material DPM may be provided on the substrate SUB (refer to FIG. 1) via the cell opening MOP defined through the masks MM. The light emitting layer EML may be formed on the substrate SUB (refer to FIG. 1) using the deposition material DPM.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A deposition apparatus comprising:

a mask frame;

a plurality of masks disposed on the mask frame;

a first plate disposed on the masks;

a second plate disposed on the first plate;

a plurality of upper driving units disposed between the first plate and the second plate;

a plurality of lower driving units disposed between the plurality of upper driving units and the first plate; and a plurality of magnet units respectively disposed in magnet unit accommodation spaces, wherein the plurality of upper driving units extend in a first direction and are arranged in a second direction intersecting the first direction, the plurality of lower driving units extend in the second direction and are arranged in the first direction, each of the plurality of upper driving units comprises an upper supporter and a plurality of upper barrier walls disposed on a lower surface of the upper supporter, each of the plurality of lower driving units comprises a lower supporter and a plurality of lower barrier walls disposed on an upper surface of the lower supporter, and each of the magnet unit accommodation spaces is a space between the plurality of upper barrier walls adjacent to each other in the first direction and the plurality of lower barrier walls adjacent to each other in the second direction.

2. The deposition apparatus of claim 1, wherein each of the plurality of upper driving units independently moves in a direction substantially parallel to the first direction, and the plurality of magnet units overlapping the plurality of upper driving units in a plan view move in the direction substantially parallel to the first direction by a movement of the plurality of upper driving units.

3. The deposition apparatus of claim 2, wherein a guide rail on which a guide groove extending in the first direction is defined is formed on a lower surface of the second plate, and a guide groove coupling member is formed on a first surface of the plurality of upper driving units to move along the guide rail.

4. The deposition apparatus of claim 1, wherein each of the plurality of lower driving units independently moves in a direction substantially parallel to the second direction, and the plurality of magnet units overlapping the plurality of lower driving units in a plan view move in the direction substantially parallel to the second direction by a movement of the plurality of lower driving units.

5. The deposition apparatus of claim 4, wherein a guide rail on which a guide groove extending in the second direction is defined is formed on an upper surface of the first plate, and a guide groove coupling member is formed on a first surface of the plurality of lower driving units to move along the guide rail.

6. The deposition apparatus of claim 1, wherein the plurality of magnet units comprise:

first magnet units; and second magnet units having a polarity direction different from the first magnet units, the plurality of upper driving units and the plurality of lower driving units operate in a first mode, a second mode, and a third mode, and the first magnet units and the second magnet units are alternately arranged in the first direction and the second direction in the first mode.

7. The deposition apparatus of claim 6, wherein the first mode is changed to the second mode by a movement of the plurality of upper driving units, a same type among the first magnet units and the second magnet units are arranged in the second direction in the second mode, and the first magnet units and the second magnet units are alternately arranged in the first direction in the second mode.

8. The deposition apparatus of claim 7, wherein the plurality of masks extend in the first direction and are arranged in the second direction.

9. The deposition apparatus of claim 6, wherein the first mode is changed to the third mode by a movement of the plurality of lower driving units, a same type among the first magnet units and the second magnet units are arranged in the first direction in the third mode, and the first magnet units and the second magnet units are alternately arranged in the second direction in the third mode.

10. The deposition apparatus of claim 9, wherein the plurality of masks extend in the second direction and are arranged in the first direction.

11. The deposition apparatus of claim 1, wherein the plurality of upper driving units comprise a magnetic substance.

12. The deposition apparatus of claim 11, wherein the magnetic substance is a metal.

13. The deposition apparatus of claim 11, wherein the plurality of magnet units are respectively attached to the plurality of upper driving units overlapping in a plan view by an attractive force caused by a magnetic force of the plurality of upper driving units.

14. The deposition apparatus of claim 1, wherein the plurality of lower driving units are made of a non-magnetic substance.

15. The deposition apparatus of claim 1, wherein the first plate comprises a cooling plate.

16. The deposition apparatus of claim 1, wherein the first plate comprises an electrostatic chuck.

17. The deposition apparatus of claim 1, further comprising:

a driving unit connected to the second plate, wherein the driving unit moves in a direction substantially parallel to a third direction intersecting each of the first direction and the second direction.

18. The deposition apparatus of claim 1, wherein each of the plurality of magnet units has a cuboidal shape.

19. The deposition apparatus of claim 1, wherein the plurality of upper barrier walls are arranged in the first direction at regular intervals.

20. The deposition apparatus of claim 1, wherein the plurality of lower barrier walls are arranged in the second direction at regular intervals.

* * * * *